(12) United States Patent
Verrilli et al.

(10) Patent No.: US 11,362,672 B2
(45) Date of Patent: Jun. 14, 2022

(54) INLINE DECOMPRESSION

(71) Applicant: QUALCOMM Incorporated, San Diego, CA (US)

(72) Inventors: Colin Beaton Verrilli, Apex, NC (US); Natarajan Vaidhyanathan, Carrboro, NC (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/870,873

(22) Filed: May 8, 2020

(65) Prior Publication Data

US 2021/0351789 A1 Nov. 11, 2021

(51) Int. Cl.
*H03M 7/30* (2006.01)
*G06F 16/22* (2019.01)
*G06N 3/08* (2006.01)

(52) U.S. Cl.
CPC .......... *H03M 7/60* (2013.01); *G06F 16/2291* (2019.01); *G06N 3/08* (2013.01)

(58) Field of Classification Search
CPC . H03M 7/60; H03M 7/00; H03M 7/30; G06F 16/2291; G06N 3/08
USPC .............................................. 341/87, 50, 51
See application file for complete search history.

(56) References Cited

U.S. PATENT DOCUMENTS

| | | | |
|---|---|---|---|
| 2014/0188819 A1 | 7/2014 | Bagal et al. | |
| 2016/0124659 A1* | 5/2016 | Oportus Valenzuela | ..................... G06F 12/08 711/165 |
| 2016/0124867 A1* | 5/2016 | Oportus Valenzuela | ..................... G06F 12/1009 711/159 |
| 2017/0293659 A1 | 10/2017 | Huang | |
| 2018/0138921 A1* | 5/2018 | Arelakis | ............. H03M 7/6088 |

FOREIGN PATENT DOCUMENTS

| | | |
|---|---|---|
| GB | 2447494 A | 9/2008 |
| WO | 2017131578 A1 | 8/2017 |

OTHER PUBLICATIONS

International Search Report and Written Opinion—PCT/US2021/031310—ISA/EPO—dated Jul. 28, 2021 (192210WO).

\* cited by examiner

*Primary Examiner* — Jean B Jeanglaude
(74) *Attorney, Agent, or Firm* — Muncy, Geissler, Olds & Lowe, P.C.

(57) ABSTRACT

Stack compression refers to compression of data in one or more dimensions. For uncompressed data blocks that are very sparse, i.e., data blocks that contain many zeros, stack compression can be effective. In stack compression, uncompressed data block is compressed into compressed data block by removing one or more zero words from the uncompressed data block. A map metadata that maps the zero words of the uncompressed data block is generated during compression. With the use of the map metadata, the compressed data block can be decompressed to restore the uncompressed data block.

30 Claims, 15 Drawing Sheets

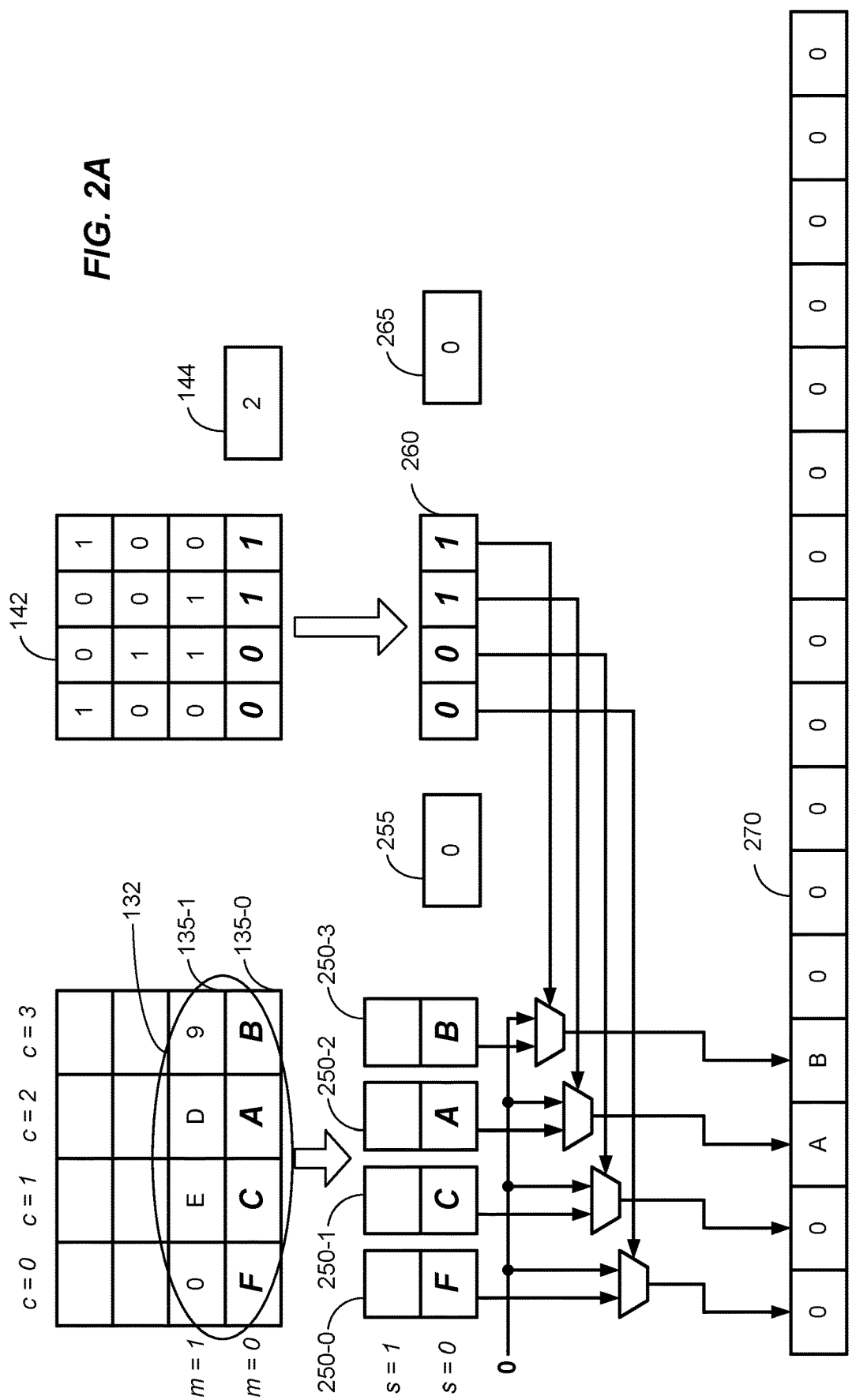

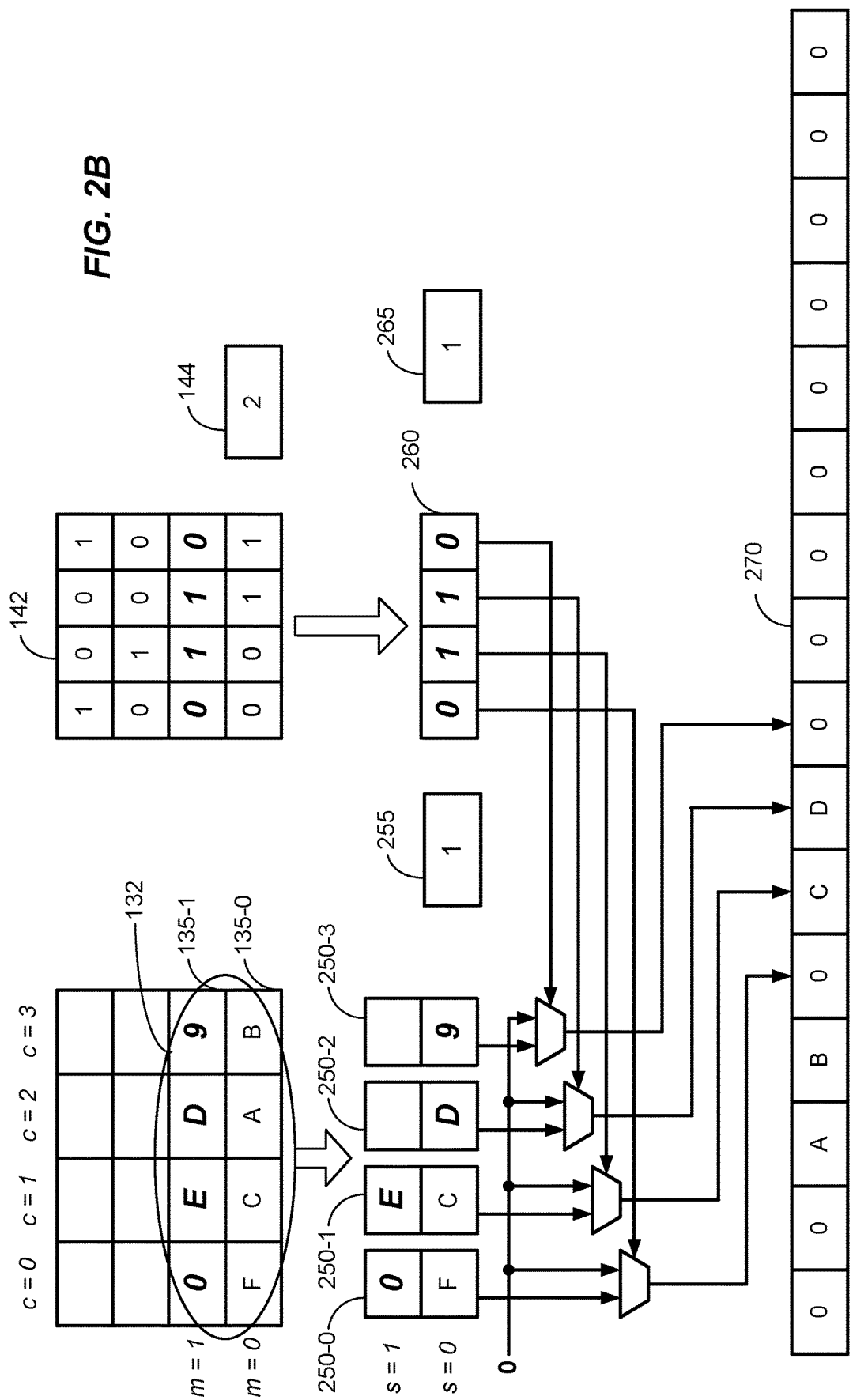

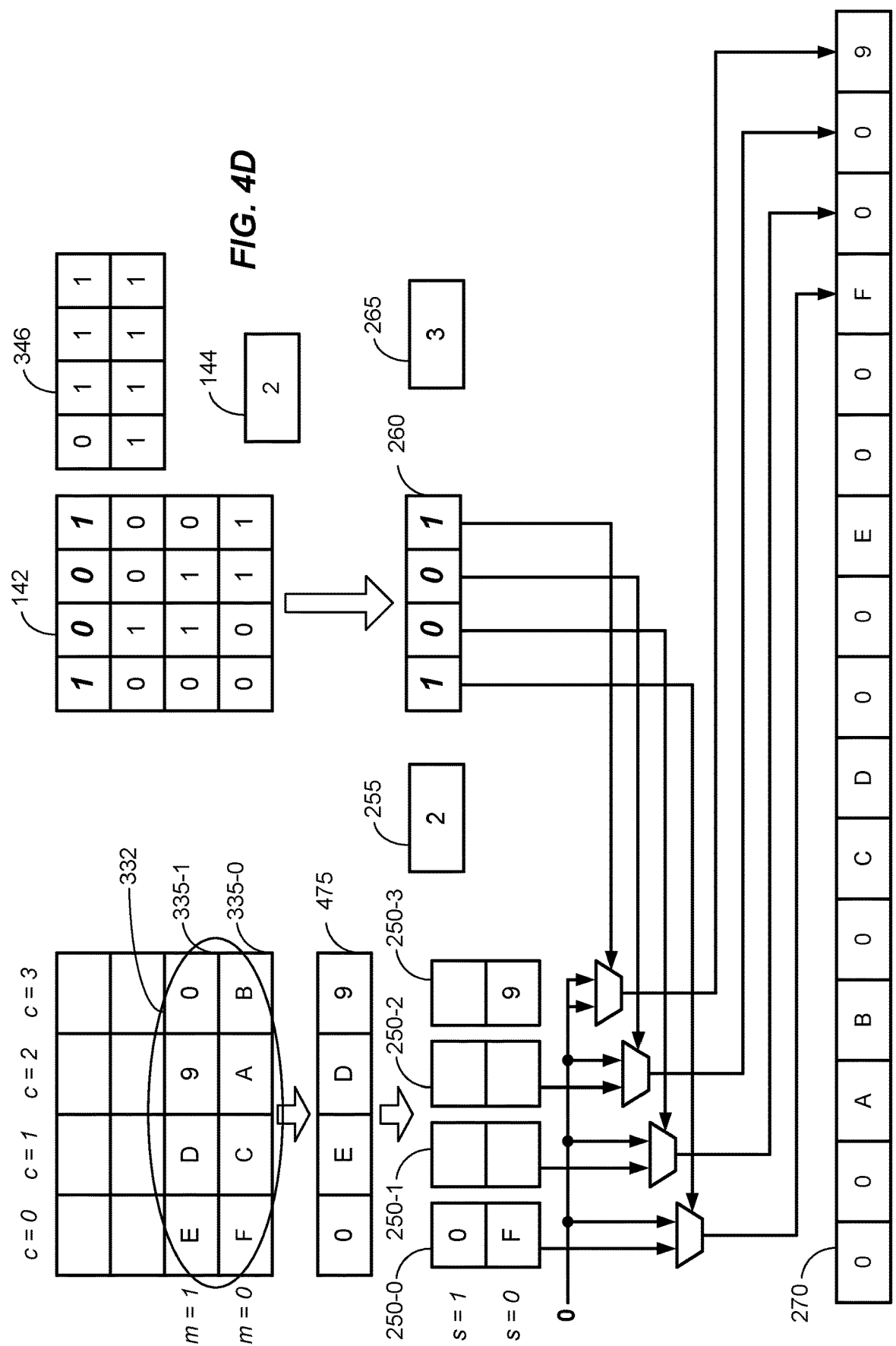

| 16 Banks | | | |
|---|---|---|---|
| Sparsity | Vertical Only | Horizontal Only | Both |
| 0 | 1.00 | 1.00 | 1.00 |
| 0.1 | 1.00 | 0.91 | 0.91 |
| 0.2 | 0.99 | 0.82 | 0.81 |
| 0.3 | 0.94 | 0.76 | 0.71 |
| 0.4 | 0.87 | 0.71 | 0.62 |
| 0.5 | 0.79 | 0.65 | 0.51 |
| 0.6 | 0.69 | 0.60 | 0.41 |
| 0.7 | 0.58 | 0.54 | 0.31 |
| 0.8 | 0.46 | 0.46 | 0.21 |
| 0.9 | 0.31 | 0.35 | 0.11 |

| 32 Banks | | | |
|---|---|---|---|
| Sparsity | Vertical Only | Horizontal Only | Both |
| 0 | 1.00 | 1.00 | 1.00 |
| 0.1 | 0.99 | 0.92 | 0.91 |
| 0.2 | 0.93 | 0.87 | 0.81 |
| 0.3 | 0.86 | 0.84 | 0.72 |
| 0.4 | 0.77 | 0.80 | 0.62 |
| 0.5 | 0.68 | 0.76 | 0.52 |
| 0.6 | 0.58 | 0.72 | 0.42 |
| 0.7 | 0.47 | 0.67 | 0.31 |
| 0.8 | 0.36 | 0.60 | 0.22 |
| 0.9 | 0.22 | 0.50 | 0.11 |

| 64 Banks | | | |
|---|---|---|---|
| Sparsity | Vertical Only | Horizontal Only | Both |
| 0 | 1.00 | 1.00 | 1.00 |
| 0.1 | 0.96 | 0.95 | 0.91 |
| 0.2 | 0.88 | 0.93 | 0.82 |
| 0.3 | 0.80 | 0.90 | 0.72 |
| 0.4 | 0.71 | 0.88 | 0.62 |
| 0.5 | 0.61 | 0.86 | 0.52 |
| 0.6 | 0.51 | 0.83 | 0.42 |
| 0.7 | 0.40 | 0.80 | 0.32 |
| 0.8 | 0.29 | 0.75 | 0.22 |
| 0.9 | 0.17 | 0.67 | 0.11 |

*FIG. 10*

INLINE DECOMPRESSION

TECHNICAL FIELD

Various aspects described herein generally relate to compression and decompression, and more particularly, to inline decompression of data that has been compressed vertically and/or horizontally.

BACKGROUND

In a neural network (NN), data with many zeros tend to be processed. This can be particularly true in NNs with rectified linear unit (ReLU) activation function, which outputs zero when the input value is zero or less and outputs the input value when the input value is positive. There can also be numerous zeros if the network is pruned. For example, in pruned recurrent neural networks (RNNs), close to 90% of the weights can be pruned. Weights in convolutional neural networks (CNNs) can also be sparse.

SUMMARY

This summary identifies features of some example aspects, and is not an exclusive or exhaustive description of the disclosed subject matter. Whether features or aspects are included in, or omitted from this summary is not intended as indicative of relative importance of such features. Additional features and aspects are described, and will become apparent to persons skilled in the art upon reading the following detailed description and viewing the drawings that form a part thereof.

An exemplary apparatus is disclosed. The apparatus may comprise a processor and a memory. The processor and the memory may be configured to retrieve a compressed data block and a map metadata. The compressed data block may comprise one or more words. The map metadata may be configured to map the words of the compressed data block to a generated decompressed data block. The processor and the memory may also be configured to decompress the compressed data block to generate the decompressed data block in accordance with the map metadata.

An exemplary method is disclosed. The method may comprise retrieving a compressed data block and a map metadata. The compressed data block may comprise one or more words. The map metadata may be configured to map the words of the compressed data block to a generated decompressed data block. The method may also comprise decompressing the compressed data block to generate the decompressed data block in accordance with the map metadata.

Another exemplary apparatus is disclosed. The apparatus may comprise means for retrieving a compressed data block and a map metadata. The compressed data block may comprise one or more words. The map metadata may be configured to map the words of the compressed data block to a generated decompressed data block. The apparatus may also comprise means for decompressing the compressed data block to generate the decompressed data block in accordance with the map metadata.

A non-transitory computer-readable medium storing computer-executable instructions for an apparatus is disclosed. The executable instructions may comprise one or more instructions causing the apparatus to retrieve a compressed data block and a map metadata. The compressed data block may comprise one or more words. The map metadata may be configured to map the words of the compressed data block to a generated decompressed data block. The executable instructions may also comprise one or more instructions causing the apparatus to decompress the compressed data block to generate the decompressed data block in accordance with the map metadata.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of examples of one or more aspects of the disclosed subject matter and are provided solely for illustration of the examples and not limitation thereof:

FIGS. 2A-2D illustrate various stages of a decompression operation to decompress the compressed data block of FIG. 1 to generate decompressed data block that may be performed by a decompression engine in accordance with one or more aspects;

FIGS. 4A-4D illustrate various stages of a decompression operation to decompress compressed data block of FIG. 3 to generate decompressed data block that may be performed by a decompression engine in accordance with one or more aspects;

FIG. 10 illustrate simulated results of compression achieved by the proposed compression/decompression techniques in accordance with one or more aspects.

DETAILED DESCRIPTION

Figure 1:
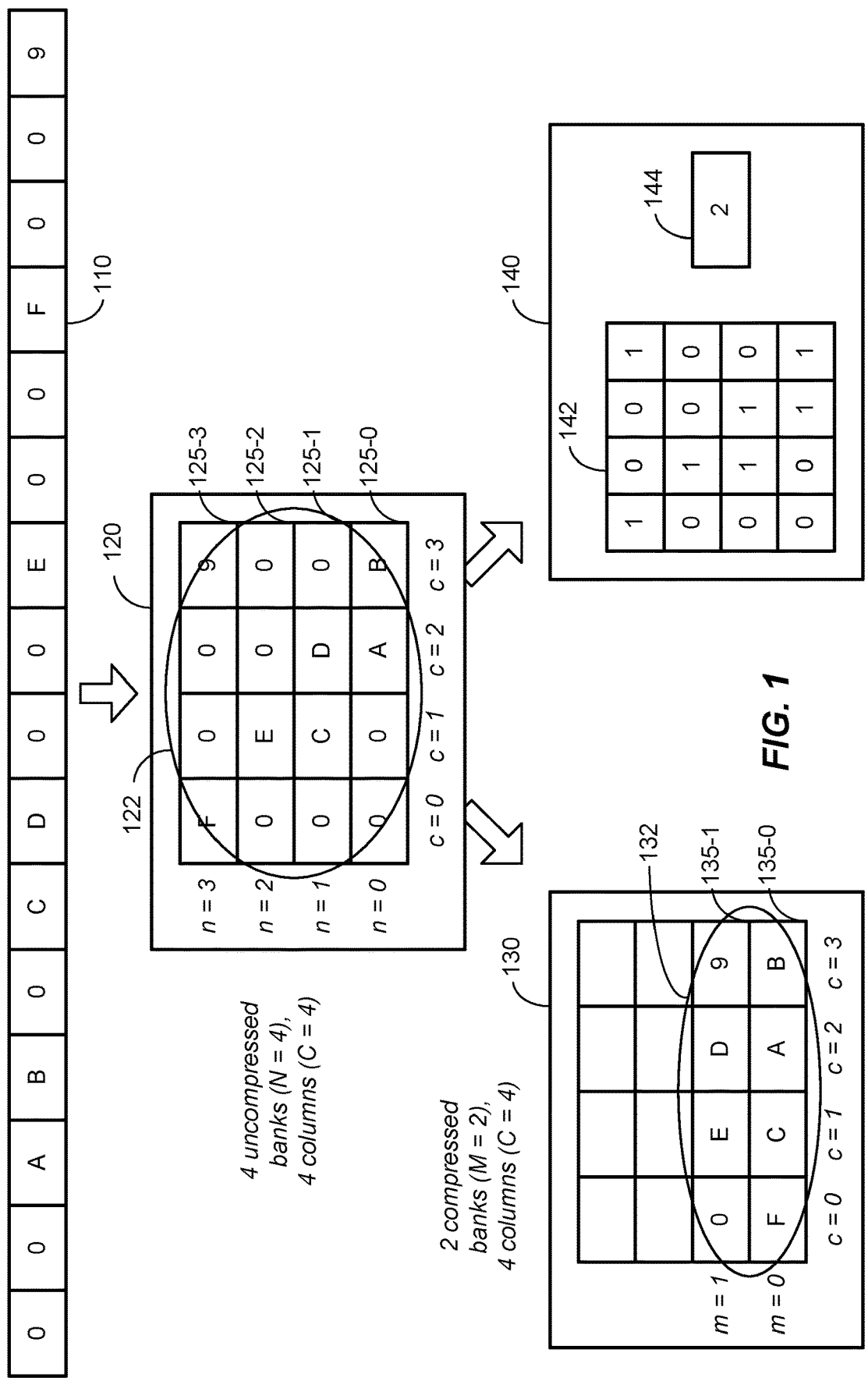
FIG. 1 illustrates an example of a stack compression that may be performed by a compression engine to generate compressed data block from uncompressed data block in accordance with one or more aspects.

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage, or mode of operation.

The terminology used herein describes particular aspects only and should not be construed to limit any aspects disclosed herein. As used herein, the singular forms "a,"

"an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Further, various aspects may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequences of actions described herein can be considered to be embodied entirely within any form of non-transitory computer-readable medium having stored thereon a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to" and/or other structural components configured to perform the described action.

It is indicated above that neural networks can have many zeros. As an illustration, sparsity of RNN weight matrices/tensors can be close to 90% sparse. If the weights can be compressed, this can be advantageous with large RNNs. One advantage is that amount of weights that can fit in on-chip memory or SRAM can be increased. Another advantage is that on-chip static random access memory (SRAM) bandwidth can be lowered. Yet another advantage can be that dynamic RAM (e.g., double data rate (DDR) memory) bandwidth can be lowered if spilling weights into memory (e.g., RAM, DRAM, DDR, SDR, QDR, etc.) becomes necessary.

In one or more aspects, it is proposed to provide techniques to efficiently compress and decompress data with many zeros, such as in neural network environments. It is noted that weights in neural network inference accelerators tend not to change. Thus, the weights can be compressed offline. The compressed weights and corresponding metadata, which may map zero and non-zero words of original uncompressed data, can be loaded into memory of an apparatus and then into another memory (e.g., tightly coupled memory (TCM)) of the apparatus. The apparatus may include a decompression engine that decompresses the compressed weights. The decompression engine may be purely hardware, or may be a combination of hardware and software.

While neural network are discussed, this is not the only environment where the proposed techniques are applicable. The proposed techniques can apply to system that introduces sparsity into weight tensors, such as a machine learning (ML) network that can be pruned. Even more generally, it is envisioned that the proposed techniques can apply to any environment in which data with significant amount of zeros are processed such as when processing sparse matrices. In such instances, significant compression can be achieved by reducing the number of zeros stored in the compressed data relative to the original data.

As mentioned above, weights may be compressed by a compression engine. More generally, original data may be compressed by a compression engine, and the proposed decompression technique(s) may be performed by the decompression engine. The proposed decompression engine may be purely software, e.g., implemented as executable instructions stored in memory and performed by one or more general purpose processors. However, for performance reasons, it may be preferred that the decompression engine is implemented purely in hardware or is hardware based at least in part (e.g., application specific integrated circuits (ASICs), field programmable gate arrays (FPGAs), etc.). Similarly, the compression engine may also be implemented purely in software, purely in hardware, or in a combination of software and hardware.

The compression engine and the decompression engine may be physically separate or may be integrated together, at least in part, with each other in a single device. However, in the discussion that follows, the compression engine and the decompression engine will be treated logically as being separate and independent components. In other words, the compression and decompression engines may operate independently of each other. For example, the compression engine may operate to compress original data into compressed data and store the compressed data in storage without regard to when the compressed data will be decompressed. The decompression engine may later obtain the compressed data (e.g., by accessing the storage and/or by receiving from a component that has access to the storage) and decompress the compressed data back into original data. Of course it is also contemplated that the compression and decompression engines may communicate with each other (e.g., directly and/or through an intermediate component) so that the compression and decompression occur within some defined time frame.

In one or more aspects, the compression engine may perform stack compression to compress original data into compressed data. A stack compression may be viewed as a compression scheme in which the original data, which is organized in multiple dimensions, is compressed in at least one of those dimensions. For example, original data may be organized in two dimensions (e.g., in rows and columns), and the compressed data may be the original data compressed in the row dimension and/or in the column dimension.

Before proceeding further, it should be noted that data (e.g., original and/or compressed) need not physically be organized in multiple dimensions. For example, it may be that original data may be stored in memory locations with consecutive addresses. Indeed, at the extreme, the original data may be stored in one or more non-consecutive locations if the order of the original data can be maintained (e.g., through pointers, tables, etc.). Of course, if the physical memory is organized in multiple dimensions (e.g., pages, banks, rows, columns, words, etc.), it may be advantageous also organize the data (original and/or compressed) to match the memory dimensions or otherwise make efficient use of the physical memory.

FIG. 1 illustrates an example of a stack compression that may be performed by a compression engine to generate compressed data from original data. The compression may be performed offline, i.e., without regard to when or even if the compressed data will be decompressed. This means that the compression can take place in software if compression speed is not an issue and/or if the software compression performance is satisfactory. Alternatively and/or in addition thereto, the compression may be performed in concert with corresponding decompression (described with reference to FIGS. 2A-2D below).

In one or more aspects, the original data, which may be of any size, maybe divided into chunks, which may also be referred to as uncompressed data blocks. Each chunk, i.e., each uncompressed data block, may be stacked compressed by the compression engine into a compressed data block. A decompression engine may decompress each compressed data block to recover the corresponding uncompressed data block.

In FIG. 1, a line 110 represents an example of an uncompressed data block 122 (an example chunk) of original uncompressed data that may be stacked compressed. The line 110 may comprise a plurality of words (16 in this instance) of the original data. The original data in line 110 may be read and saved in a first memory 120 in units of banks. That is, the uncompressed data block 122 may be stored in the first memory 120 may be stored in N banks (or rows) and C columns of the first memory 120. Again, it should be noted that "banks" and "columns" are conceptual. Banks and/or columns may or may not have correspondence to physical memory.

In an aspect, a read granularity of a read operation may be a word or a bank. In this instance, a bank comprises four words, i.e., four words of the line 110 may be read at a time (for a bank read granularity) for storage in the first memory 120. For clarity, the uncompressed data block 122 may be viewed as being stored in N uncompressed banks, N≥1, with each uncompressed bank n, (n=0 . . . N−1) comprising C columns of words, C≥1. In FIG. 1, there are four (N=4) uncompressed banks 125-$n$ (n=0, 1, 2, 3, collectively uncompressed banks 125), each with four (C=4) words. Note that the word can be of any fixed length (e.g., 16 bits, 32 bits, etc.).

In FIG. 1, a word may be a zero word or a non-zero word. A zero word, shown as "0", may represent a word whose value is zero. Conversely, a non-zero word, shown with something other than "0" (e.g., shown as "A", "B", "C", etc.) may represent a word whose value is not zero.

The uncompressed data block 122 in the uncompressed banks 125 may be stack compressed in a dimension, e.g., in a row dimension, also referred to as vertical compression, resulting in compressed data block 132 stored in second memory 130 in M compressed banks, M≥1. Each compressed bank m, (m=0 . . . M−1) may also comprise C columns of words. Note that the first and second memories 120, 130 may be same or different.

In this row compression, the uncompressed data block 122 may be compressed into the compressed data block 132 by removing one or more zero words from the uncompressed data block. In an aspect, leading and intermediate zero words within each column of the uncompressed banks 125 may be removed, i.e., compressed out, such that the non-zero words are pushed down in the compressed banks 135-$m$ (m=0, 1, collectively compressed banks 135). For example, it is seen that the non-zero value "F" occupying location (n=3, c=0) of the uncompressed banks 125 (i.e., prior to compression) occupies location (m=0, c=0) of the compressed banks 135, which indicates that zero words of locations (n=0, c=0), (n=1 , c=0), and (n=2, c=0) of the uncompressed banks 125 are removed. As another example, it is seen that the non-zero value "9" occupying location (n=3, c=3) of the uncompressed banks 125 prior to compression occupies location (m=1, c=3) of the compressed banks 135, which indicates that zero words of locations (n=1 , c=3) and (n=2, c=3) are removed.

Through vertical compression, the number of banks may be reduced, i.e., M<N. In FIG. 1, four uncompressed banks 125 within the first memory 120 are reduced to two compressed banks 135 within the second memory 130. The worst case can occur when there is one column c within the uncompressed banks 125 that has all non-zero words, in which case, M=N. Thus, in general, M≤N.

Some characteristics/consequences of the stack compression will now be described. In one characteristic, the non-zero words of the original data of the uncompressed data block 122 may be maintained in the compressed data block 132 without modification, even though their locations may change. For example, non-zero word "E" in location (n=2, c=1) of the uncompressed banks 125 may be stored as the same non-zero word "E" in location (m=1, c=1) of the compressed banks 135.

This implies that the number of non-zero words of the compressed data block 132 remains equal to the number of non-zero words of the uncompressed data block 122. On the other hand, the number of zero words of the compressed data block 132 may be less than or equal to the number of zero words of the uncompressed data block 122. Basically, when M<N, the number of zero words in the compressed data block 132 will be less.

In another characteristic, regarding the compressed data block 132 in the M compressed banks 135, there may be at least one column such that the words at the column for all M compressed banks 135 are non-zero words. In FIG. 1 for example, it is seen that columns c=1, 2, and 3 of the M compressed banks 135 are fully occupied with non-zero words. This is a natural outgrowth of the illustrated stack compression in that if all columns have at least one zero word, further row compression can take place.

In a further characteristic, also regarding the compressed data block 132 in the M compressed banks 135, it is possible for there can be a column in which there are both zero and non-zero words at that column. When there is such a column, then within that column, each zero word occupies a bank that is above a bank occupied by each non-zero word. More formally, for each column c, c=0 . . . C−1, when there are both zero and non-zero words at that column c for the M compressed banks 135, each compressed bank $m_{NZ}$ with a non-zero word at that column c may be a lower bank than each compressed bank $m_Z$ with a zero word at that column c, i.e., $m_{NZ}<m_Z$ for each column c of the M compressed banks 135. For example, in FIG. 1, it is seen that in column c=0, it is seen that non-zero word F occupies compressed bank 135-0 ($m_{NZ}=0$) and that zero-word occupies bank 135-1 ($m_Z=1$). One outgrowth is that the lowest bank (m=$m_{NZ}$=0) of each column of the M compressed banks 135 is occupied by a non-zero word.

As a part of compression operation, the compression engine may generate a map metadata 142. As will be described in further detail below, the map metadata 142 may be used by the decompression engine to decompress the compressed data block 132. Broadly, the map metadata 142 may map all non-zero words of the original uncompressed data. For example, with respect to the N uncompressed banks 125, the map metadata 142 may map locations of zero and non-zero words of uncompressed data block 122. For example, each bit of the map metadata 142 may correspond to a word location of the N uncompressed banks 125, i.e., may correspond to a word of the uncompressed data block 122. Also, a bit value within the map metadata 142 may indicate whether the corresponding word of the uncompressed data block 122 is a zero or a non-zero word. It is thus seen that the size of the map metadata 142 may be a fraction that is inversely proportional to the size of the word of the uncompressed data block 122 (e.g., ⅛, ⅟₁₆, etc.). The map metadata 142 may be stored in metadata storage 140.

While not shown, note that if all of the words in the original data line 110 are zero words, the map metadata 142 may be correspondingly filled with all zero bits. When this occurs, the uncompressed data block 122 may include only zero words. That is, the N uncompressed banks 125 may be filled with zero words. Also, the compressed data block 132 may be empty, i.e., the number of compressed banks M=0.

In the example of FIG. 1, the map metadata 142 is illustrated as a matrix of N rows×C columns in which each element (n, c), n=0 . . . N−1, c=0 . . . C−1 of the map metadata 142 corresponds to a word in uncompressed bank n, column c of the original data. As seen, each element (n, c) of the map metadata 142 is zero when the corresponding word of the uncompressed data block 122 is a zero word, and is non-zero when the corresponding word of the original data is a non-zero word. As indicated above, size of each element (n, c) of the map metadata 142 may be smaller than the size of a word of the uncompressed data block 122. For example, each element (n, c) of the map metadata 142 may be a single bit that indicates whether the corresponding word of the uncompressed data block 122 is a zero word or a non-zero word.

Before proceeding further, the following should be noted. Thus far, the illustrative compression described has involved distinguishing between zero words and non-zero words, and compressing out the zero words. However, this is merely an example. It is fully contemplated to generalize the concept to distinguish between "removable" and "non-removable" words, where a removable word may be word having a removable value (can be any value such as zero), and a non-removable word may be a word having a value other than the removable value. In this instance, the map metadata 142 may map to removable and non-removable words of the uncompressed data block 122, and each bit of the map metadata 142 may indicate whether the corresponding word of the uncompressed data block 122 is a removable word or a non-removable word.

Also, the concept may be extended to allow for multiple removable values. For example, the original data may be such that three values show up significantly more than other. In this instance, each element (n, c) may be two-bits long with one combination of two bits (e.g., [11]) representing non-removable word, and the other three (e.g., [00, 01, 10]) representing first, second, and third values of removable words.

But for ease of reference and discussion, zero and non-zero words will be used in the remainder of the disclosure, keeping in mind that the discussed concepts can be generalized in a straightforward manner.

The compression engine may also generate a num-compressed-banks metadata 144. The num-compressed-banks metadata 144 may represent a value equal to the number of compressed banks M. The decompression engine may decompress the compressed data block 132 based on the num-compressed-banks metadata 144 in addition to the metadata size 142. The num-compressed-banks metadata 144 also may be stored in the metadata storage 140.

It should be noted that num-compressed-banks metadata 144 is optional in that the compression engine need not provide the num-compressed-banks metadata 144. This is because the num-compressed-banks metadata 144 may be determined during decompression based on the map metadata 142. For example, recall that the compressed data block 132 is a result of the compression engine stack compressing the uncompressed data block 122 in the N uncompressed banks 125 in a dimension (the row dimension in this instance). A similar dimensional compression may be performed on the map metadata 142 by the decompression engine to determine the number of compressed banks M. However, when the num-compressed-banks metadata 144 is provided as part of compression, this means that fewer operations will need to be performed during decompression.

FIGS. 2A-2D illustrate various stages of a decompression operation that may be performed by a decompression engine to the compressed data of FIG. 1 to generate decompressed data block, which should be the same as the original uncompressed data block 122. In FIGS. 2A-2D, the second memory 130 and the metadata storage 140 will not be illustrated so as to reduce clutter. The decompression operation is the focus of these figures. Thus, when the memory is mentioned in the context of the decompression operation, it may be assumed that the second memory 130 is referenced unless indicated otherwise.

In FIG. 2A, there may be a C number of queues 250 corresponding to the C columns of the compressed banks 135. Each queue 250-c may have a depth S number of slots. The number of slots S may be any number S≥1. But in most instances, S=N/2 may be sufficient. Each queue 250-c may have a separate counter, which is not illustrated so as to reduce clutter. Also, a map register 260, and a line register 270 may be provided to aid in the decompression. For example, the line register 270 may be populated with the decompressed data block as decompression takes place.

In addition, a row index register 265 may be provided to keep a count of a row index n, and a compressed bank index register 255 may be provided to keep a count of a compressed bank index m. It should be noted that some or all of the registers are not necessarily required. For example, decompressed bank rows may be streamed out from the decompression engine. In this example, the decompressed data block may be streamed out four words at a time, i.e., a bank at a time.

Recall from above that in some instances, the uncompressed data block 122 may include only zero words. In this instance, the operation performed by a decompression engine may be greatly simplified. For example, the decompression engine may first determine whether there are compressed data to decompress. This determination may be made by examining the num-compressed-banks metadata 144, which may be provided by the compression engine, or may be derived from the map metadata 142. If the num-compressed-banks metadata 144 indicates that M=0 (no compressed data), then the decompression engine may simply populate the line register 270—populate the decompressed data block—with all zero words.

On the other hand, if the num-compressed-banks metadata 144 indicates that M>0, then the decompression engine may decompress the compressed data block 132. FIGS. 2A-2D illustrate example stages when there is data to decompress, i.e., when M>0. FIGS. 2A, 2B, 2C, and 2D respectively illustrate extracting bank 0, bank 1, bank 2, and bank 3 values of the uncompressed data block 122 from the compressed data block 132.

Figure 2C:
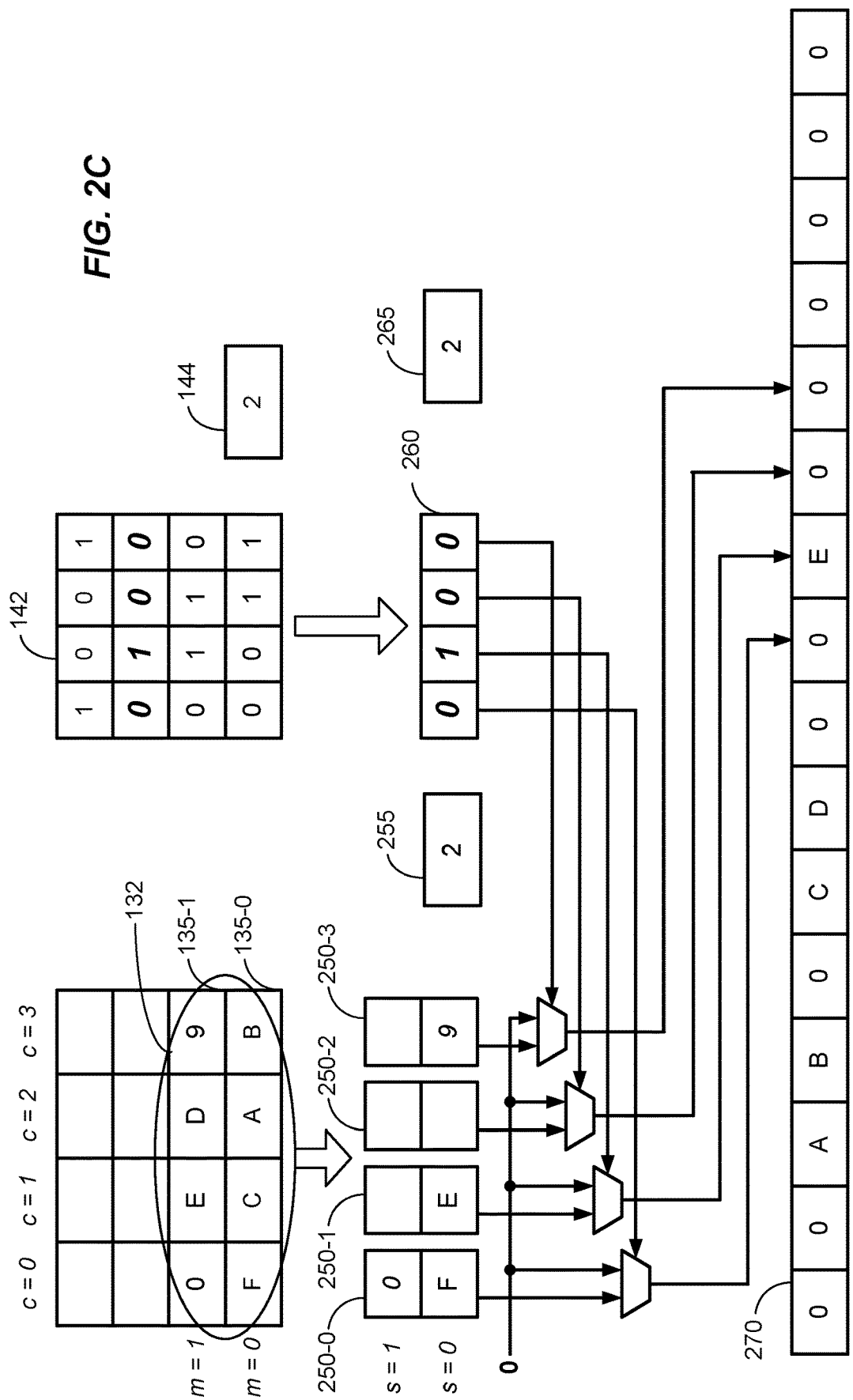

The decompression process of FIG. 2A performed by the decompression engine to generate bank 0 of the decompressed data block (recover bank 0 of the uncompressed data block 122) may be as follows:

Initialize row index n:
In FIG. 2A, row index register 265 is set to 0 (n=0).
Since row index n<N, read row n (i.e., row 0) from the map metadata 142 into the map register 260:

In FIG. 2A, map register 260 is loaded with row 0 entries [0,0,1,1] of the map metadata 142.
Initialize compressed bank index m:
  In FIG. 2A, compressed bank index register 255 is set to 0 (m=0).
Since compressed bank index m<M, load words of compressed bank m of the compressed data block 132 (i.e., bank 0 of the compressed banks 135) into queues 250 such that the word of each column c of the compressed bank m occupies a lowest unoccupied slot of the corresponding queue 250-c:
  In FIG. 2A, prior to loading compressed data from the compressed bank 135-0 to queues 250, slot 0 of the queues 250 are all unoccupied. Therefore, slots 0 of queues 250-c, c=0, 1, 2, 3 are loaded with [F,C,A,B] from compressed bank 135-0.
Pop words from heads, which are slots 0, of the queues 250 based on the row n entries of the map metadata 142 (stored in the map register 260) and load the popped words into corresponding locations of the line register 270:
  In FIG. 2A, word locations 0-3 of the line register 270 correspond to row 0 of the map metadata 142, and also correspond to bank 0 of the uncompressed data block 122 and to bank 0 of the decompressed data block.
  The map register 260 is "ANDed" with the queues 250 to indicate the following:
  A "0" in column c of the map register 260 indicates that the corresponding queue 250-c should NOT be popped. Instead, a zero word should be loaded in the corresponding location of the line register 270 (of the decompressed data block).
  A "1" in column c of the map register 260 indicates that the corresponding queue 250-c should be popped, and the popped word should be loaded in the corresponding location of the line register 270 (of the decompressed data block).
    The map register is loaded with row 0 entries [0,0,1,1] of the map metadata 142 indicating that data values "A", "B" in heads (slot 0's) of queues 250-2, 250-3 are to be popped and loaded in word locations 2 and 3 of the line register 270 corresponding to columns 2 and 3 of bank 0 of the decompressed data block.
    Word locations 0 and 1 of the line register 270 corresponding to columns 0 and 1 of bank 0 of the decompressed data block are filled with zeros.
As a result, bank 0 values [0,0,A,B] of the uncompressed bank 125-0 are recovered.
In FIG. 2A (as well as in FIGS. 2B-2D), multiplexors are included to indicate an example of how the map register 260 may be used to pop the queues 250 in the recovery process. As seen in an aspect, the entries in the map register 260 may be used to control a multiplexor. However, it should be noted actual implementation may be accomplished in a variety of ways.
The decompression process of FIG. 2B performed by the decompression engine to generate bank 1 of the decompressed data block (recover bank 1 of the uncompressed data block 122) may be as follows:
  Increment row index n:
    In FIG. 2B, row index register 265 is incremented (n=1).
  Since row index n<N, read row n (i.e., row 1) from the map metadata 142 into the map register 260:
    In FIG. 2B, map register 260 is loaded with row 1 entries [0,1,1,0] of the map metadata 142.
  Since compressed bank index m<M, increment compressed bank index m:
    In FIG. 2B, compressed bank index register 255 is incremented (m=1).
  Since incremented compressed bank index m<M, load words of compressed bank m of the compressed data block 132 (i.e., bank 1 of the compressed banks 135) into queues 250 such that the word of each column c of the compressed bank m occupies a lowest unoccupied slot of the corresponding queue 250-c:
    In FIG. 2B, for queues 250-0, 250-1, lowest unoccupied slots are slots 1 for both since their heads (slots 0) were not popped previously. Thus slots 1 for queues 250-0, 250-1 are loaded with [0,E] from columns 0, 1 of compressed bank 135-1.
    For queues 250-2, 250-3, lowest unoccupied slots are slots 0 for both since their heads were popped previously. Thus slots 0 for queues 250-2, 250-3 are loaded with [D,9] from columns 2, 3 of compressed bank 135-1.
  Pop words from heads (slot 0) of the queues 250 based on the row n entries of the map metadata 142 (stored in the map register 260) and load the popped words into corresponding locations of the line register 270:
    In FIG. 2B, word locations 4-7 of the line register 270 correspond to row 1 of the map metadata 142, and also correspond to bank 1 of the uncompressed data block 122 and to bank 1 of the decompressed data block.
    The map register 260 is loaded with row 1 entries [0,1,1,0] of the map metadata 142 indicating that data values "C", "D" in heads (slot 0's) of queues 250-1, 250-2 are to be popped and loaded in word locations 5 and 6 of the line register 270 corresponding to columns 1 and 2 of bank 1 of the decompressed data block.
    Word locations 4 and 7 of the line register 270 corresponding to columns 0 and 3 of bank 1 of the decompressed data block are filled with zeros.
As a result, bank 1 values [0,C,D,0] of the uncompressed bank 125-1 are recovered.
The decompression process of FIG. 2C performed by the decompression engine to generate bank 2 of the decompressed data block (recover bank 2 of the uncompressed data block 122) may be as follows:
  Increment row index n:
    In FIG. 2C, row index register 265 is incremented (n=2).
  Since row index n<N, read row n (i.e., row 2) from the map metadata 142 into the map register 260:
    In FIG. 2C, map register 260 is loaded with row 2 entries [0,1,0,0] of the map metadata 142.
  Since compressed bank index m<M, increment compressed bank index m:
    In FIG. 2B, compressed bank index register 255 is incremented (m=2).
  Since incremented compressed bank index m is not less than M indicating that all compressed banks 135 have been read, no loading of words from the compressed data block 132 (compressed banks 135) takes place.
    In FIG. 2C, slots 0 of queues 250-0, 250-1, 250-2, 250-3 have values [F,E,empty,9], which is the state of the queues after popping the queues in FIG. 2B.
  Pop words from heads (slot 0) of the queues 250 based on the row n entries of the map metadata 142 (stored in the map register 260) and load the popped words into corresponding locations of the line register 270:

In FIG. 2C, word locations 8-11 of the line register 270 correspond to row 2 of the map metadata 142, and also correspond to bank 2 of the uncompressed data block 122 and to bank 2 of the decompressed data block.

The map register 260 is loaded with row 2 entries [0,1,0,0] of the map metadata 142 indicating that data value "E" in the head of queue 250-1 is to be popped and loaded in word location 9 of the line register 270 corresponding to column 1 of bank 2 of the decompressed data block.

Word locations 8, 10 and 11 of the line register 270 corresponding to columns 0, 2 and 3 of bank 2 of the decompressed data block are filled with zeros.

As a result, bank 2 values [0,E,0,0] of the uncompressed bank 125-2 are recovered.

Figure 2D:
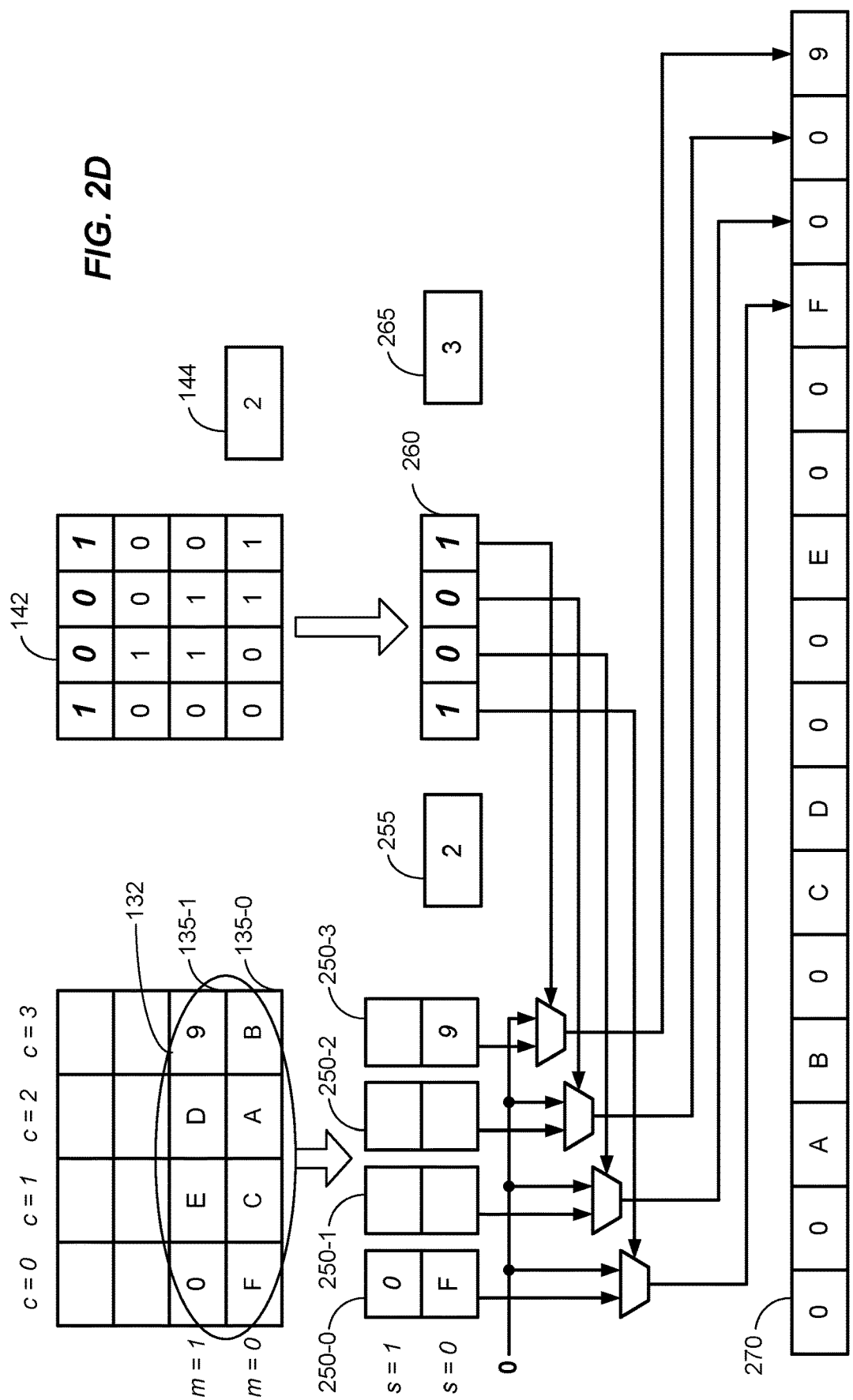

The decompression process of FIG. 2D performed by the decompression engine to generate bank 3 of the decompressed data block (recover bank 3 of the uncompressed data block 122) may be as follows:

Increment row index n:
  In FIG. 2D, row index register 265 is incremented (n=3).
  Since row index n<N, read row n (i.e., row 3) from the map metadata 142 into the map register 260:
    In FIG. 2D, map register 260 is loaded with row 3 entries [1,0,0,1] of the map metadata 142.
  Since incremented compressed bank index m is not less than M indicating that all compressed banks 135 have been read, no loading of words from the compressed data block 132 (compressed banks 135) takes place.
    In FIG. 2D, slots 0 of queues 250-0, 250-1, 250-2, 250-3 have values [F,empty,empty,9], which is the state of the queues after popping the queues in FIG. 2C.
  Pop words from heads (slot 0) of the queues 250 based on the row n entries of the map metadata 142 (stored in the map register 260) and load the popped words into corresponding locations of the line register 270:
    In FIG. 2D, word locations 12-15 of the line register 270 correspond to row 3 of the map metadata 142, and also correspond to bank 3 of the uncompressed data block 122 and to bank 3 of the decompressed data block. o The map register 260 is loaded with row 3 entries [1,0,0,1] of the map metadata 142 indicating that data values "F" and "9" in the heads of queue 250-0 and 250-3 are to be popped and loaded in word locations 12 and 15 of the line register 270 corresponding to columns 0 and 3 of bank 3 of the decompressed data block.
    Word locations 13 and 14 of the line register 270 corresponding to columns 1 and 2 of bank 3 of the decompressed data block are filled with zeros.

As a result, bank 3 values [F,0,0,9] of the uncompressed bank 125-3 are recovered. Moreover, the entirety of the original data in line 110 is recovered without loss.

Note that in one or more aspects, the first bank (e.g., bank 0) may be varied depending upon address to distribute bank reads. Also, actual number of words per bank (e.g., actual C) and number of banks (e.g., actual M) may vary. For example, if 2K page size is assumed, then the memories 120, 130, and hence the uncompressed and compressed banks may be organized in groups of 128×16b words (e.g., as 8 banks with 16 words per bank) or in groups of 64×16b words (e.g., as 16 banks with 4 words per bank). Of course, these are merely examples, and other organizations are possible. Also the compression is limited by the worst column. Better effective compression may be achieved with more banks. However, latencies may increase with increased number of banks.

Figure 3:
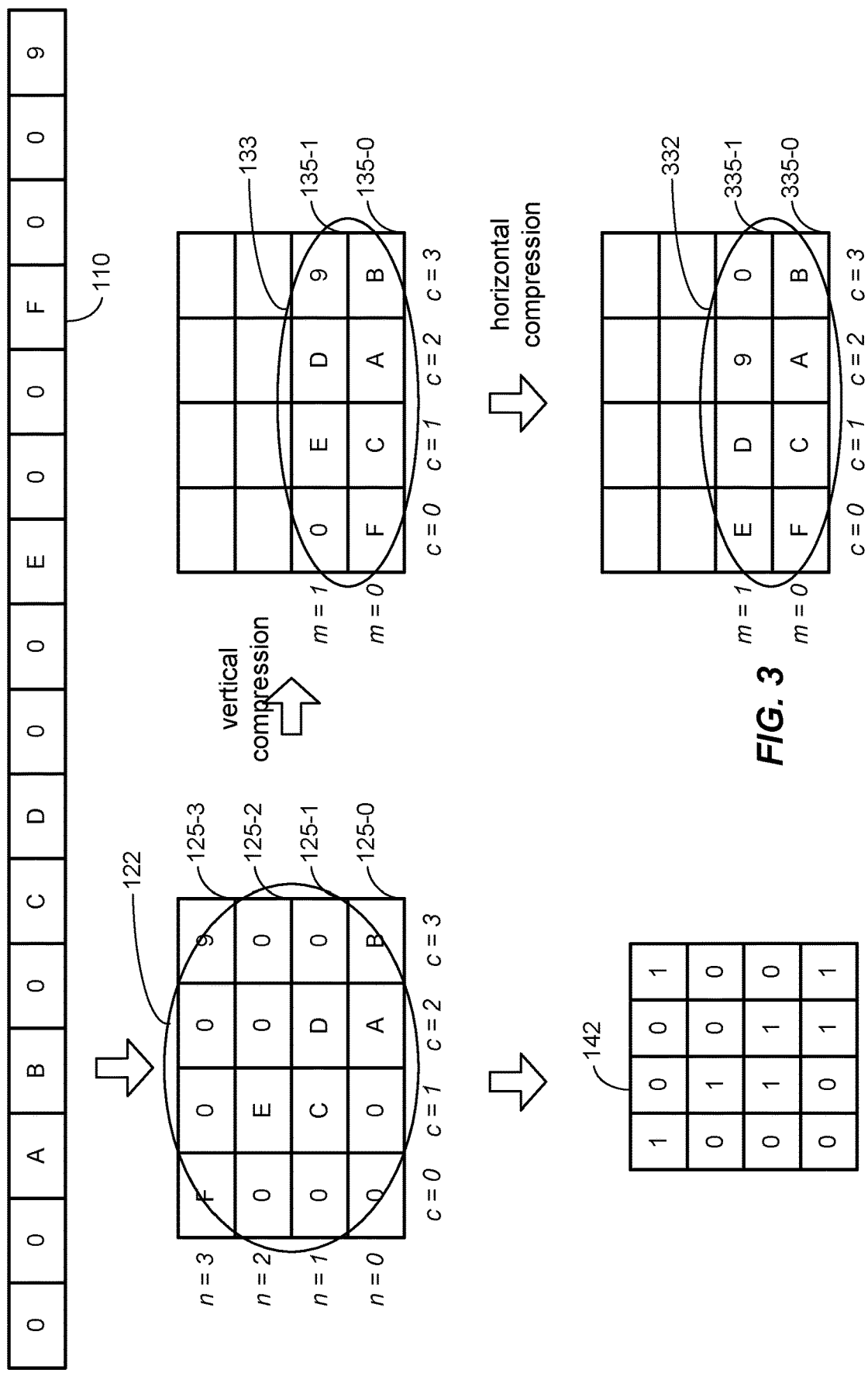
FIG. 3 illustrates another example of a stack compression that may be performed by a compression engine to generate compressed data block from uncompressed data block in accordance with one or more aspects.

FIG. 3 illustrates another example of the stack compression that may be performed by the compression engine to generate compressed data block from original data. The compression of FIG. 3 may be performed offline. Alternatively and/or in addition thereto, the compression of FIG. 3 may be performed in concert with corresponding decompression (described with reference to FIGS. 4A-4D below). The stack compression in FIG. 3 differs from FIG. 1 in that additional compression in another dimension (e.g., in a column/horizontal dimension) may be performed. For example, after performing the vertical compression, the compression engine may perform horizontal compression on the vertically compressed data.

In FIG. 3, same original data and of FIG. 1 will be used for description. So as to reduce clutter, memories 120, 130 and metadata storage 140 are not shown in FIG. 3. In FIG. 3, after the compression in the first dimension (e.g., vertical compression) which generates an intermediate compressed data block 133, the states of the compressed banks 135 are the same as the compressed banks 135 of FIG. 1. That is, the intermediate compressed data block 133 is the same as the compressed data block 132 of FIG. 1. However, after the compression in the second dimension (e.g., horizontal compression) to generate the final compressed data block 332 (or simply compressed data block 332), a result is that the values may be shifted left to remove zero "holes" from the intermediate compressed data block 133. This can result to save reading of zero words from memory, and thus save power. For clarification purposes, the compressed banks after the horizontal compression are indicated with "335".

The stack compression of FIG. 3 (also referred to as 2D compression) may share characteristics of the stack compression of FIG. 1 (also referred to as 1D compression) (e.g., equal number of non-zero words with original data, unmodified non-zero words, same or less number of zero words with originals data, etc.).

There may also be some different characteristics. For example, each compressed bank 335 may lead with non-zero words. That is, in each compressed bank m of the compressed banks 335, each column $c_{NZ}$ of that compressed bank m with a non-zero word may be a lower column than each column $c_Z$ of that compressed bank m with a zero word, i.e., $c_{NZ}<c_Z$. For example, it is seen that in the compressed bank 335-1, non-zero words occupy columns 0, 1, 2 and then zero word occupy column 3.

While not shown, if all of the words in the original data line 110 are zero words, there may be very little difference with the 2D compression relative to the 1D compression. For example, uncompressed data block 122 may only include zero words, the map metadata 142 may be filled with only zero bits, and the compressed data block 332 may be empty, i.e., the number of compressed banks M=0.

As such, there may also be little to no difference in the decompression as well. That is, the decompression engine may determine whether there is compressed data to decompress, e.g., by examining the num-compressed-banks metadata 144, which may be provided by the compression engine or may be derived by the decompression engine from the map meta data 142. If the num-compressed-banks metadata 144 indicates that M=0, the decompression engine may simply populate the line register 270, i.e., populate the decompressed data block, with all zeros.

FIGS. 4A-4D illustrate various stages of a decompression operation that may be performed by the decompression engine to the 2D compressed data block 332 of FIG. 3 to generate the decompressed data block when the compressed data block 332 is not empty (i.e., when M>0). In FIGS. 4A-4D, it may be assumed that the memories 120 and/or 130 may be made "read under mask" (explained below). Also in these figures, in addition to the load map metadata 142 and the num-compressed-banks metadata 144, the metadata storage 140 (not shown) may also store a column metadata 346 that maps zero and non-zero locations of the compressed data block 332 after compression in the row dimension and before compression in the column dimension, i.e., the column metadata 346 may map the zero and non-zero locations (more generally, removable and non-removable locations) of the intermediate compressed data block 133.

Similar to the num-compressed-banks metadata 144, the compression engine may provide the column metadata 346. But again, this is optional from the perspective of the compression engine in that the column metadata 346 may be determined from the map metadata 142 by the decompression engine. For example, note that the 2D compressed data block 332 is a result of the compression engine stack compressing the uncompressed data block 122 in the N uncompressed banks 125 in two dimensions. A similar two dimensional compression may be performed on the map metadata 142 by the decompression engine to determine the column metadata 346. Nonetheless, when the column metadata 346 is provided as part of compression, fewer operations will need to be performed during decompression.

In FIGS. 4A-4D, it may be assumed that the queues 250, the map register 260, the line register 270, the row index register 265, and the compressed bank index register 255 may also be used. Also, a shifter 475 may be provided, e.g., to provide column decompression capabilities.

Figure 4A:
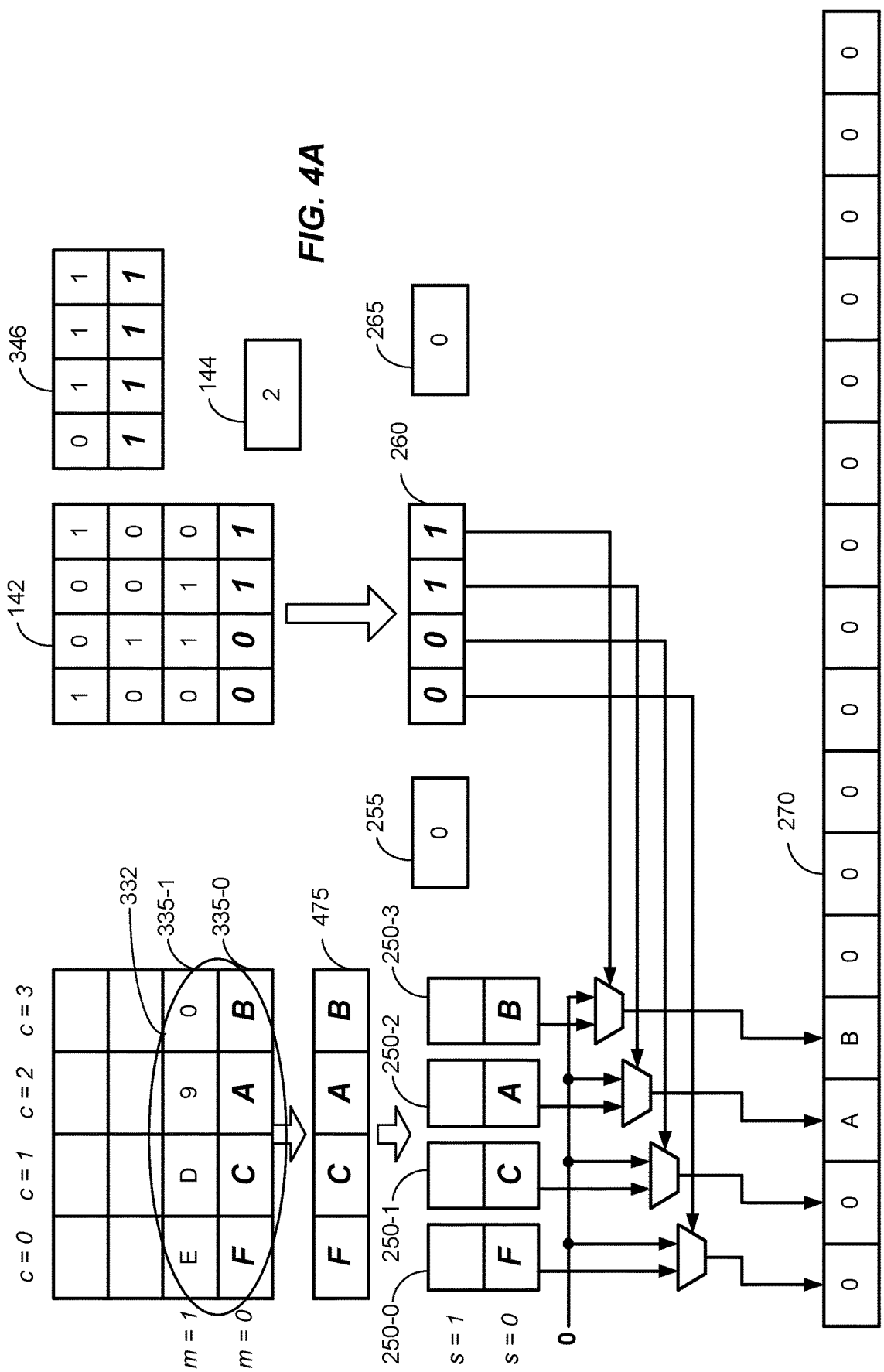

The decompression process of FIG. 4A performed by the decompression engine to generate bank 0 of the decompressed data block (recover bank 0 of the uncompressed data block 122) may be as follows:

Initialize row index n:
In FIG. 4A, row index register 265 is set to 0 (n=0).
Since row index n<N, read row n (i.e., row 0) from the map metadata 142 into the map register 260:
In FIG. 4A, map register 260 is loaded with row 0 entries [0,0,1,1] of the map metadata 142.
Initialize compressed bank index m:
In FIG. 4A, compressed bank index register 255 is set to 0 (m=0).
Since compressed bank index m<M, read row m (i.e., row 0) from the column metadata 346:
In FIG. 4A, row 0 entries [1,1,1,1] of the column metadata 346 are highlighted (bold, italicized).
Since compressed bank index m<M, perform read-under-mask to read words of compressed bank m of the compressed data block 332 (i.e., bank 0 of the compressed banks 335), and load the words into queues 250.
Read-under-mask is a read operation in which only the left most k words of the compressed bank m (bank 0) is read, in which k is the number of 1's in the row m (row 0) of the column metadata 346. In this instance, since k=4, all four words [F,C,A,B] of the compressed bank 335-0 are read into the column shifter 475.
In FIG. 4A, the data [F,C,A,B] read from the compressed bank 335-0 is NOT shifted within the shifter 475 since there are no zeros in row 0 entries [1,1,1,1] of the column metadata 346.
Slots 0 of the queues 250 are loaded with [F,C,A,B] from the shifter 475.
Pop words from heads (slot 0) of the queues 250 based on the row n entries of the map metadata 142 (stored in the map register 260) and load the popped words into corresponding locations of the line register 270:
In FIG. 4A, word locations 0-3 of the line register 270 correspond to row 0 of the map metadata 142, and also correspond to bank 0 of the uncompressed data block 122 as well as to bank 0 of the decompressed data block.
The map register is loaded with row 0 entries [0,0,1,1] of the map metadata 142 indicating that data values "A", "B" in heads (slot 0's) of queues 250-2, 250-3 are to be popped and loaded in word locations 2 and 3 of the line register 270 corresponding to columns 2 and 3 of bank 0 of the decompressed data block.
Word locations 0 and 1 of the line register 270 corresponding to columns 0 and 1 of bank 0 of the decompressed data block are filled with zeros.
As a result, bank 0 values [0,0,A,B] of the uncompressed bank 125-0 are recovered.
Similar to FIGS. 2A-2D, in FIGS. 4A-4D, AND gate is included to indicate an example of how the map register 260 may be used to pop the queues 250 in the recovery process. The actual implementation may be accomplished in a variety of ways. For example, in an aspect, the entries in the map register 260 may be used to control a multiplexor (not shown).

The decompression process of FIG. 4B performed by the decompression engine to generate bank 1 of the decompressed data block (recover bank 1 of the uncompressed data block 122) may be as follows:

Increment row index n:
In FIG. 4B, row index register 265 is incremented (n=1).
Since row index n<N, read row n (i.e., row 1) from the map metadata 142 into the map register 260:
In FIG. 4B, map register 260 is loaded with row 1 entries [0,1,1,0] of the map metadata 142.
Since compressed bank index m<M, increment compressed bank index m:
In FIG. 4B, compressed bank index register 255 is incremented (m=1).
Since incremented compressed bank index m<M, read row m (i.e., row 1) from the column metadata 346:
In FIG. 4B, row 1 entries [0,1,1,1] of the column metadata 346 are highlighted (bold, italicized).
Since incremented compressed bank index m<M, perform read-under-mask to read words of the compressed bank m of the compressed data block 332 (i.e., bank 1 of the compressed banks 335), column shift the words from the compressed bank m in accordance with the row m read from the column metadata 346, and load the shifted words corresponding to column c to occupy the lowest unoccupied slot of the corresponding queue 250-*c*.
In this instance, k=3. Thus, three left most words [E,D,9] of the compressed bank 335-1 are read into the shifter 475 when the read-under-mask is performed.
In FIG. 4B, the read data [E,D,9] is column shifted within the shifter 475 in accordance with the row 1 entries [0,1,1,1] of the column metadata 346 (is shifted by one column as [0,E,D,9] due to the leading entry 0 in row 1 of the column metadata 346).

For queues 250-0, 250-1, lowest unoccupied slots are slots 1 for both since their heads (slots 0) were not popped previously, and for queues 250-2, 250-3, lowest unoccupied slots are slots 0 for both since their heads were popped previously. Slots 1 for queues 250-0, 250-1 are loaded with [0,E], and slots 0 for queues 250-2, 250-3 are loaded with [D,9].

Figure 4B:
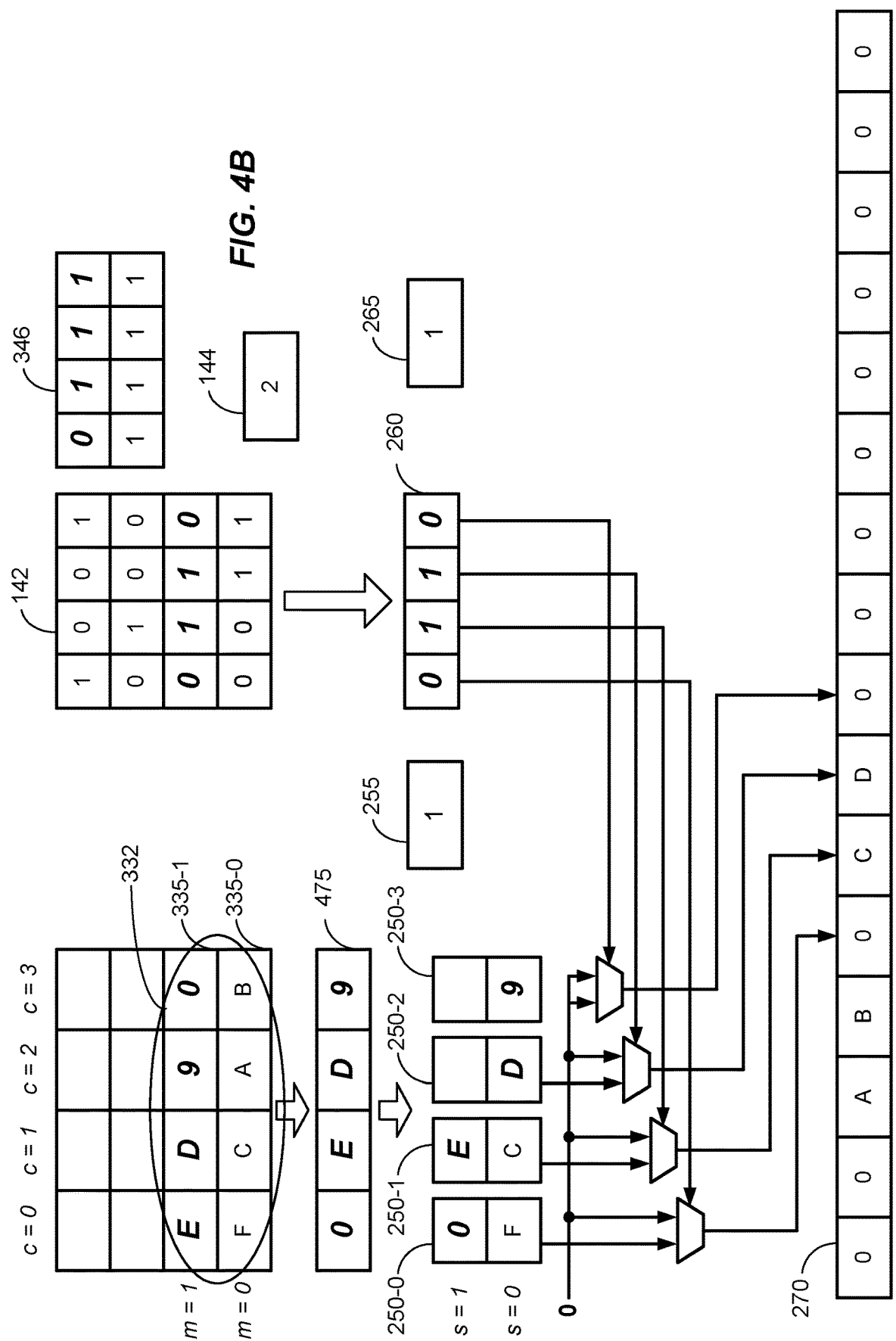

Pop words from heads (slot 0) of the queues 250 based on the row n entries of the map metadata 142 (stored in the map register 260) and load the popped words into corresponding locations of the line register 270:

In FIG. 4B, word locations 4-7 of the line register 270 correspond to row 1 of the map metadata 142, and also correspond to bank 1 of the uncompressed data block 122 as well as to bank 1 of the decompressed data block.

The map register 260 is loaded with row 1 entries [0,1,1,0] of the map metadata 142 indicating that data values "C", "D" in heads (slot 0's) of queues 250-1, 250-2 are to be popped and loaded in word locations 5 and 6 of the line register 270 corresponding to columns 1 and 2 of bank 1 of the decompressed data block.

Word locations 4 and 7 of the line register 270 corresponding to columns 0 and 3 of bank 1 of the decompressed data block are filled with zeros.

As a result, bank 1 values [0,C,D,0] of the uncompressed bank 125-1 are recovered.

The decompression process of FIG. 4C performed by the decompression engine to generate bank 1 of the decompressed data block (recover bank 1 of the uncompressed data block 122) may be as follows:

Increment row index n:
In FIG. 4C, row index register 265 is incremented (n=2).
Since row index n<N, read row n (i.e., row 2) from the map metadata 142 into the map register 260:
In FIG. 4C, map register 260 is loaded with row 2 entries [0,1,0,0] of the map metadata 142.
Since compressed bank index m<M, increment compressed bank index m:
In FIG. 4B, compressed bank index register 255 is incremented (m=2).
Since compressed bank index m is not less than M indicating that all rows of the column metadata 346 have been read, no reading from the column metadata 346 takes place.
In FIG. 4C, no rows of the column metadata 346 are highlighted.
Since incremented compressed bank index m is not less than M indicating that all compressed banks 335 have been read, no loading of words from the compressed data block 332 (compressed banks 335) takes place.
In FIG. 4C, slots 0 of queues 250-0, 250-1, 250-2, 250-3 have values [F,E,empty,9], which is the state of the queues after popping the queues in FIG. 4B.

Figure 4C:
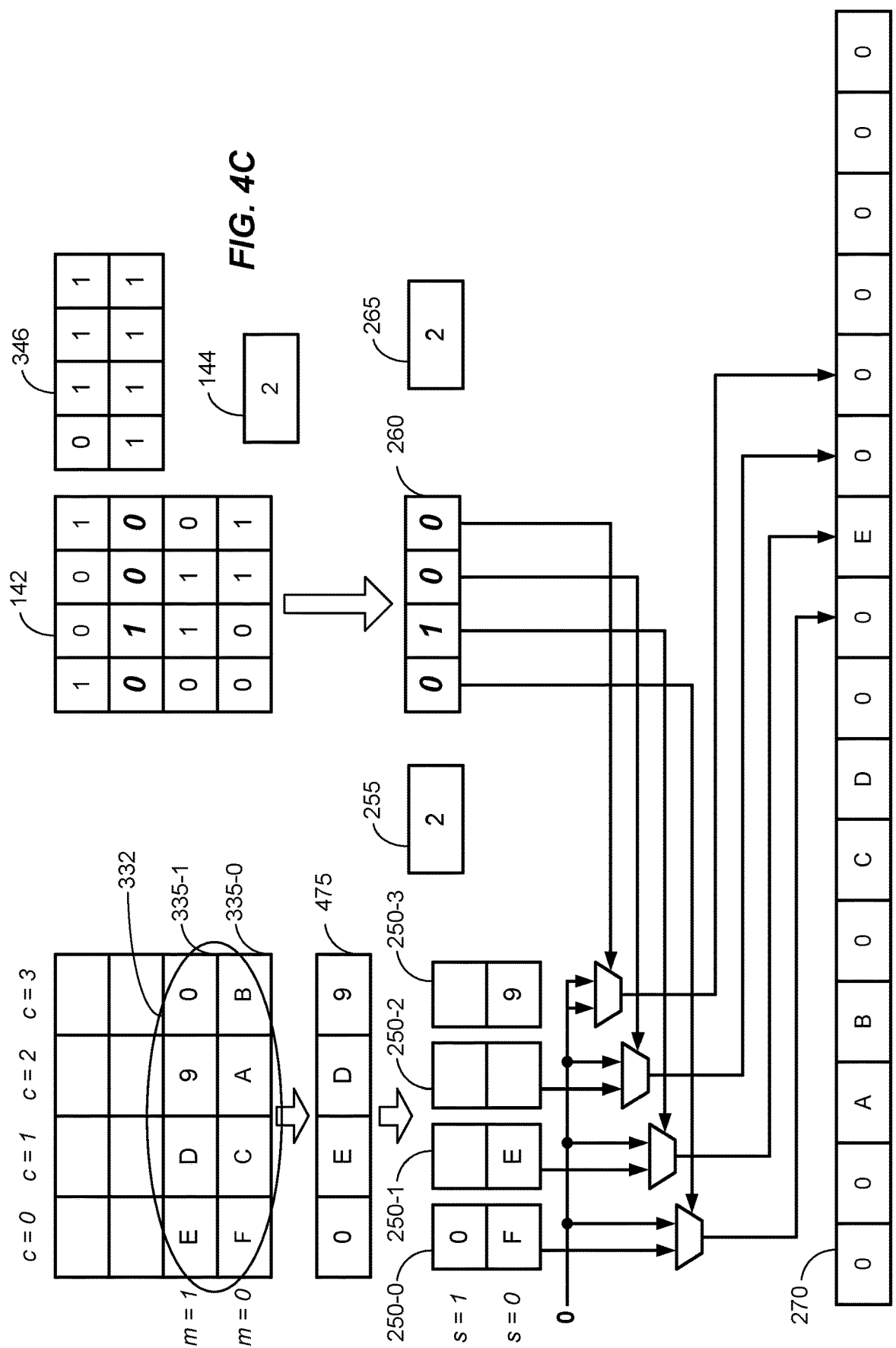

Pop words from heads (slot 0) of the queues 250 based on the row n entries of the map metadata 142 (stored in the map register 260) and load the popped words into corresponding locations of the line register 270:

In FIG. 4C, word locations 8-11 of the line register 270 correspond to row 2 of the map metadata 142, and also correspond to bank 2 of the uncompressed data block 122 as well as to bank 2 of the decompressed data block.
The map register 260 is loaded with row 2 entries [0,1,0,0] of the map metadata 142 indicating that data value "E" in the head of queue 250-1 is to be popped and loaded in word location 9 of the line register 270 corresponding to column 1 of bank 2 of the decompressed data block.
Word locations 8, 10 and 11 of the line register 270 corresponding to columns 0, 2 and 3 of bank 2 of the decompressed data block are filled with zeros.

As a result, bank 2 values [0,E,0,0] of the uncompressed bank 125-2 are recovered.

The decompression process of FIG. 4D performed by the decompression engine to generate bank 3 of the decompressed data block (recover bank 3 of the uncompressed data block 122) may be as follows:

Increment row index n:
In FIG. 4D, row index register 265 is incremented (n=3).
Since row index n<N, read row n (i.e., row 3) from the map metadata 142 into the map register 260:
In FIG. 4D, map register 260 is loaded with row 3 entries [1,0,0,1] of the map metadata 142.
Since incremented compressed bank index m is not less than M indicating that all compressed banks 335 have been read, no loading of words from the compressed data block 332 (compressed banks 335) takes place.
In FIG. 4D, slots 0 of queues 250-0, 250-1, 250-2, 250-3 have values [F,empty,empty,9], which is the state of the queues after popping the queues in FIG. 4C.

Pop words from heads (slot 0) of the queues 250 based on the row n entries of the map metadata 142 (stored in the map register 260) and load the popped words into corresponding locations of the line register 270:

In FIG. 4D, word locations 12-15 of the line register 270 correspond to row 3 of the map metadata 142, and also correspond to bank 3 of the uncompressed data block 122 as well as to bank 3 of the decompressed data block.
The map register 260 is loaded with row 3 entries [1,0,0,1] of the map metadata 142 indicating that data values "F" and "9" in the heads of queue 250-0 and 250-3 are to be popped and loaded in word locations 12 and 15 of the line register 270 corresponding to columns 0 and 3 of bank 3 of the decompressed data block.
Word locations 13 and 14 of the line register 270 corresponding to columns 1 and 2 of bank 3 of the decompressed data block are filled with zeros.

As a result, bank 3 values [F,0,0,9] of the uncompressed bank 125-3 are recovered. Moreover, the entirety of the original data in line 110 is recovered without loss.

Figure 5:
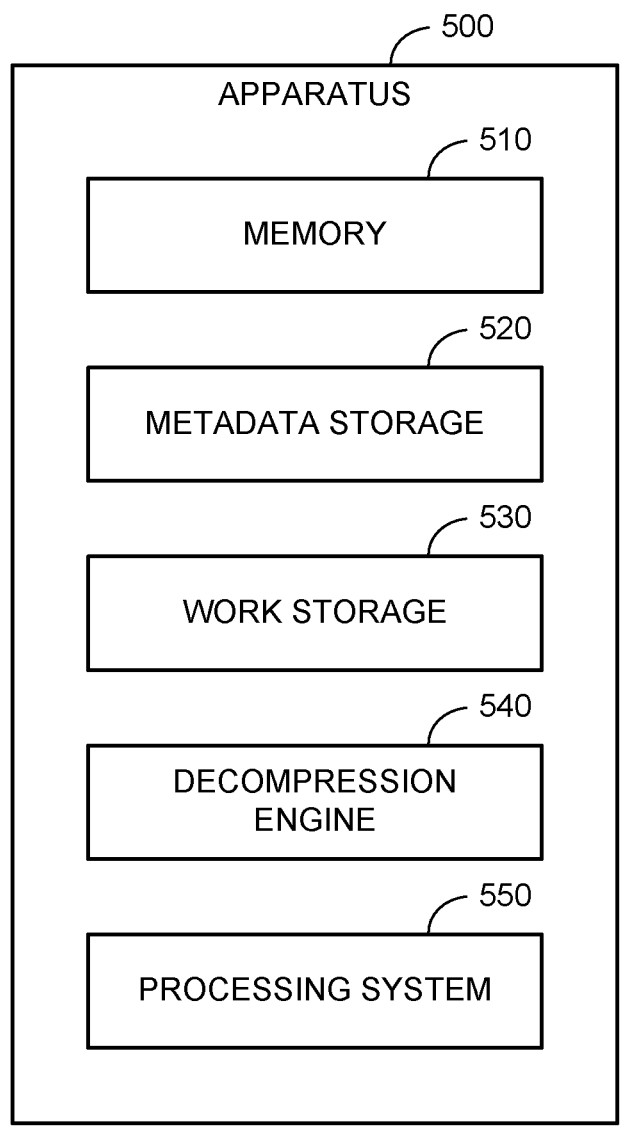
FIG. 5 illustrates a block diagram of several sample aspects of components that may be employed in an apparatus configured to decompress compressed data block in accordance with one or more aspects.

FIG. 5 illustrates an exemplary apparatus 500 configured to perform decompression on stack compressed data. For example, the apparatus 500 may generate decompressed data block by decompressing compressed data block 132, 332, in which the uncompressed data block 122 is recovered in the decompressed data block. The apparatus 500 may include a memory 510 comprising a plurality of banks. While not illustrated, the memory 510 may be configured to store the uncompressed data block 122 (e.g., the N uncompressed banks 125) and/or the compressed data block 132, 332 (e.g., M compressed banks 135 and/or M compressed banks 335). The memory 510 may be comprised of one or more memory components, volatile and/or non-volatile. The memory 500 may include SRAMs and/or DRAMs (e.g., DDRs).

The apparatus 500 may also include a metadata storage 520. While not illustrated, the metadata storage 520 may be configured to store the map metadata 142, the num-compressed-banks metadata 144, and/or the column metadata 346. The metadata storage 520 may comprise buffers, registers, and/or memories. The memories of the metadata storage 520 may be same or different from the memories used to store the uncompressed banks 125, the compressed banks 135, and/or the compressed banks 335.

In one or more aspects, the metadata for the compressed data block (e.g., map metadata 142, num-compressed-banks metadata 144, and/or column metadata 346) may be stored together with the compressed data block 132, 332.

The apparatus 500 may further include a work storage 530. While not illustrated, the work storage 530 may include the shifter 475, the queues 250, the map register 260, the line register 270, and/or the line 210. The work storage 530 may comprise buffers, registers, and/or memories.

The apparatus 500 may yet further include a decompression engine 540 configured to decompress the stack compressed data. The apparatus 500 may yet further include a processing system 550 configured to control the overall operations of the apparatus 500. The processing system 550 may include one or more processors (not shown). In an aspect, the processing system 550 may contribute to the decompression processing, i.e., may be a part of the decompression engine 540.

In an aspect, the decompression engine 540 may be incorporated in a neural network (NN) system. That is, the apparatus 500 may be a NN system or at least a part of a NN system. In another aspect, the decompression engine 540 may be configured in hardware, at least in part. Further, the decompression engine 540 may fully recover the original data.

Figure 6:
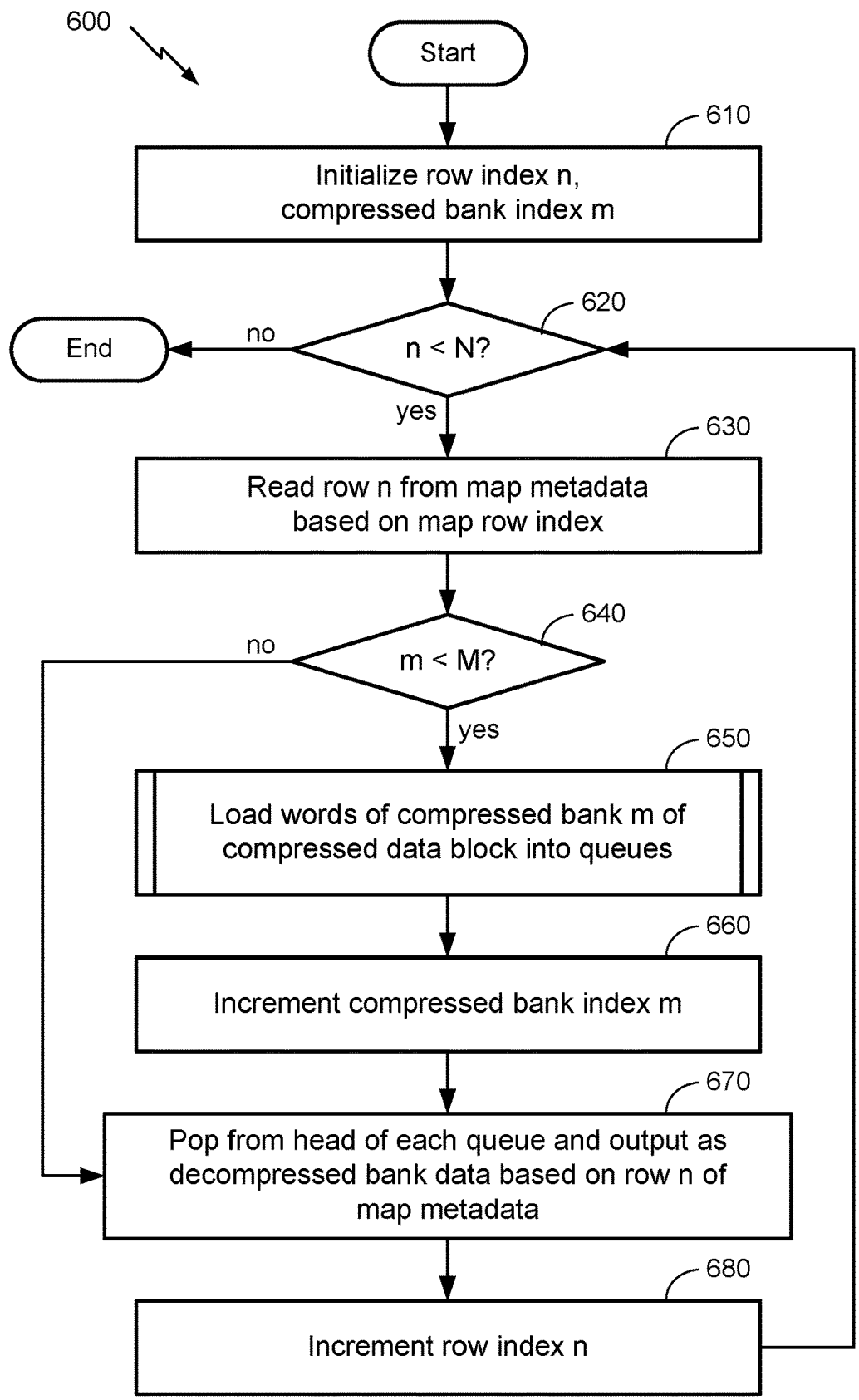
FIGS. 6-8 illustrate an exemplary method performed by a decompression engine to decompress compressed data block in accordance with one or more aspects.

FIG. 6 illustrates an exemplary method 600 performed by a decompression engine (e.g., any combination of the decompression engine 540 and/or the processing system 550 of the apparatus 500). At block 610, the decompression engine may initialize the row index n and the compressed bank index m. For example, the row index register 265 and the compressed bank index register 255 may be set to 0.

At block 620, the decompression engine may determine whether or not the decompression operation is completed. For example, the decompression engine may determine whether or not n<N. That is, the decompression engine may determine whether or not the value n in the row index register 265 is less than the number of uncompressed banks N. If not, (no branch from block 620), the decompression may be deemed to be complete. On the other hand, if n<N (no branch from block 620), then in block 630, the decompression engine may read row n from the map metadata 142.

In block 640, the decompression engine may determine whether or not all banks of the compressed data block 132, 332 (e.g., of the compressed banks 135, 335) have been read. For example, the decompression engine may determine whether or not m<M. That is, the decompression engine may determine whether or not the value m in the compressed bank index register 255 is less than the value M of the num-compressed-banks metadata 144. If not (no branch from block 640), then the decompression engine may proceed to block 670 (described further below).

Figure 7:
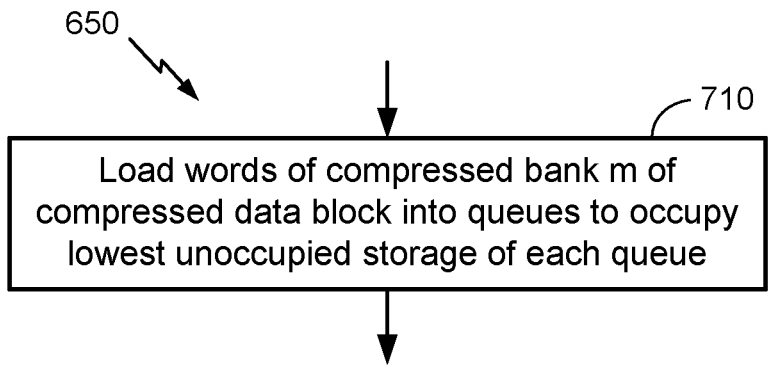

If so (yes branch from block 640), then in block 650, the decompression engine may load words of compressed bank m of the compressed data block 132, 332 (e.g., load data from bank m of the compressed banks 135, 335) into the queues 250. FIG. 7 illustrates an example process performed by the decompression engine to implement block 650. The process illustrated in FIG. 7 may apply to decompressing 1D compressed data block such as the compressed data block 132 stored in the compressed banks 135 of FIG. 1. In block 710, the decompression engine may read words of compressed bank m of the compressed banks 135, and load each word corresponding to each column c of the compressed bank m to occupy a lowest unoccupied slot of the corresponding queue 250-c (e.g., see FIGS. 2A-2D).

Regarding the slots of the queues 250, the following is noted. In FIGS. 2A-2D, 4A-4D, each queue 250-c includes S slots, in which each slot is addressed as slot s, s=0 . . . S−1. The head of each queue 250-c is slot 0, which is the lowest addressed slot of the queue 250-c. Thus, the lowest occupied slot including the head slot 0 is the unoccupied slot closest to the head. But it is recognized that in other queue implementations, the head may be the highest addressed slot S−1. In such implementations, the compressed data may be read from the compressed bank m may be loaded to occupy the highest unoccupied slot of the corresponding queue. But again, the highest unoccupied slot, including the head slot S−1 is closest to the head. Thus, in one or more aspects, the "lowest unoccupied slot" may be more generally interpreted as an unoccupied slot "closest to the head of a queue".

Figure 8:
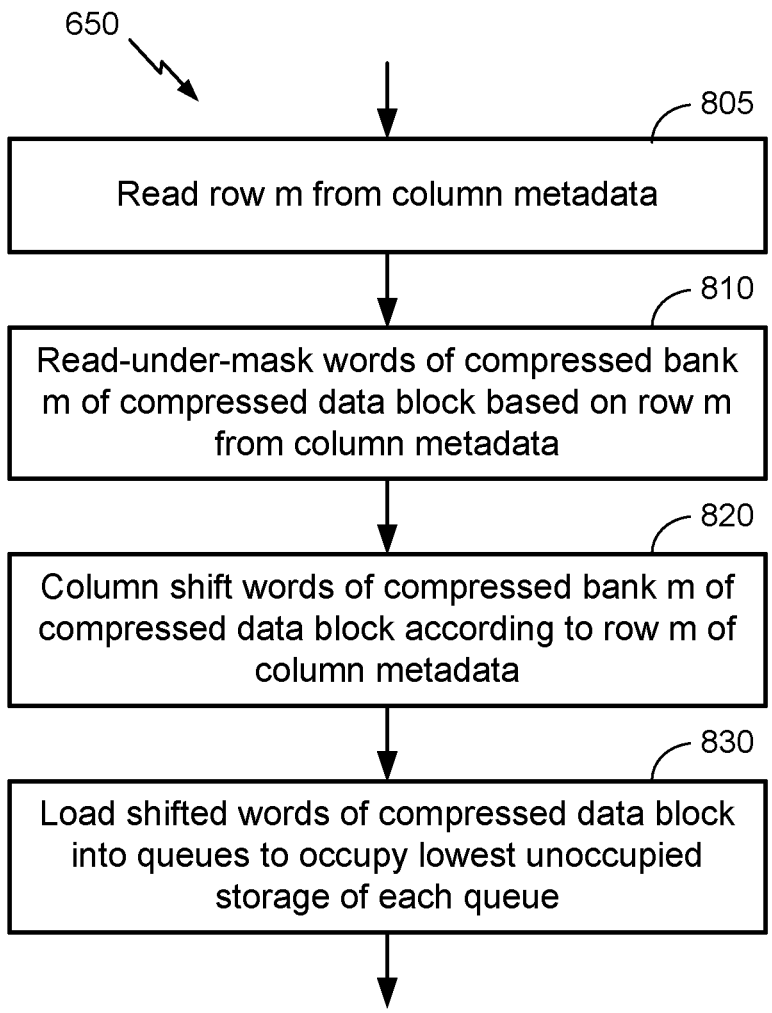

FIG. 8 illustrates another example process performed by the decompression engine to implement block 650. The process illustrated in FIG. 8 may apply to decompressing 2D compressed data block such as the compressed data block 332 stored in the compressed banks 335 of FIG. 3. In block 805, the decompression engine may read the row m of the column metadata 346, e.g., the decompression engine may read the row of the column metadata 346 based on the row value in the compressed bank index register 255. In block 810, the decompression engine may read the words of compressed bank m of the compressed data block 332 (e.g., read bank m of the compressed banks 335) based on the read row m of the column metadata 346. For example, a read-under-mask may be performed to read the left most k words of the compressed bank 335-m, where k is the number of 1's (more generally, number of entries indicating non-zero words) in the read row m of the column metadata 346. In block 820, the decompression engine may column shift the words read from the compressed bank m of the compressed banks 335 in accordance with the row m read from the column metadata 346. In block 830, the decompression engine may load each shifted word of the compressed data block 332 corresponding to each column c of the compressed bank m to occupy a lowest unoccupied slot of the corresponding queue 250-c (e.g., see FIGS. 4A-4D).

Referring back to FIG. 6, in block 660, the decompression engine may increment the compressed bank index m in the compressed bank index register 255. Then in block 670, the decompression engine may pop from head (slot 0) of each queue 250 based on the row n read from the map metadata 142 and output the popped word as decompressed bank data (e.g., see FIGS. 2A-2D, 4A-4D). For example, the popped word may be put into the corresponding column c of the line register 270 at location n and/or streamed as output. In block 680, the decompression engine may increment the row index n in the row index register 265. Then the decompression engine may proceed to block 620.

While not specifically illustrated, capacity compression can be easily added by including the start address of the line in the metadata. For example, 1 KB lines can be easily compressed. The metadata may be addressed using the given line index. Also, the metadata (e.g., map metadata 142) may be read before the compressed data. This can provide the memory address (e.g., SRAM address) of the compressed data, and may also provide the decompression metadata. As indicated, the number of banks M may be computed from the metadata.

In another aspect, the same decompression engine (e.g., the same decompressor hardware) may be used to decompress data whose words are of different lengths. For example, the same decompressor hardware may be used for INT8 words and FP16 (or INT16) words. In this instance, the base decompression hardware may be designed for smallest word length (e.g., INT8). Then in the FP16 scheme, the data low bytes (e.g., weight low bytes) and high bytes may be stored in separate blocks, and each block may be decompressed using parallel decompression engines. In this instance, the same metadata (e.g., same map metadata 142) may be used for each block. On the other hand, the parallel engines may be used to decompress different lines if the engines are decompressing the base words (e.g., INT8 words).

Figure 9:
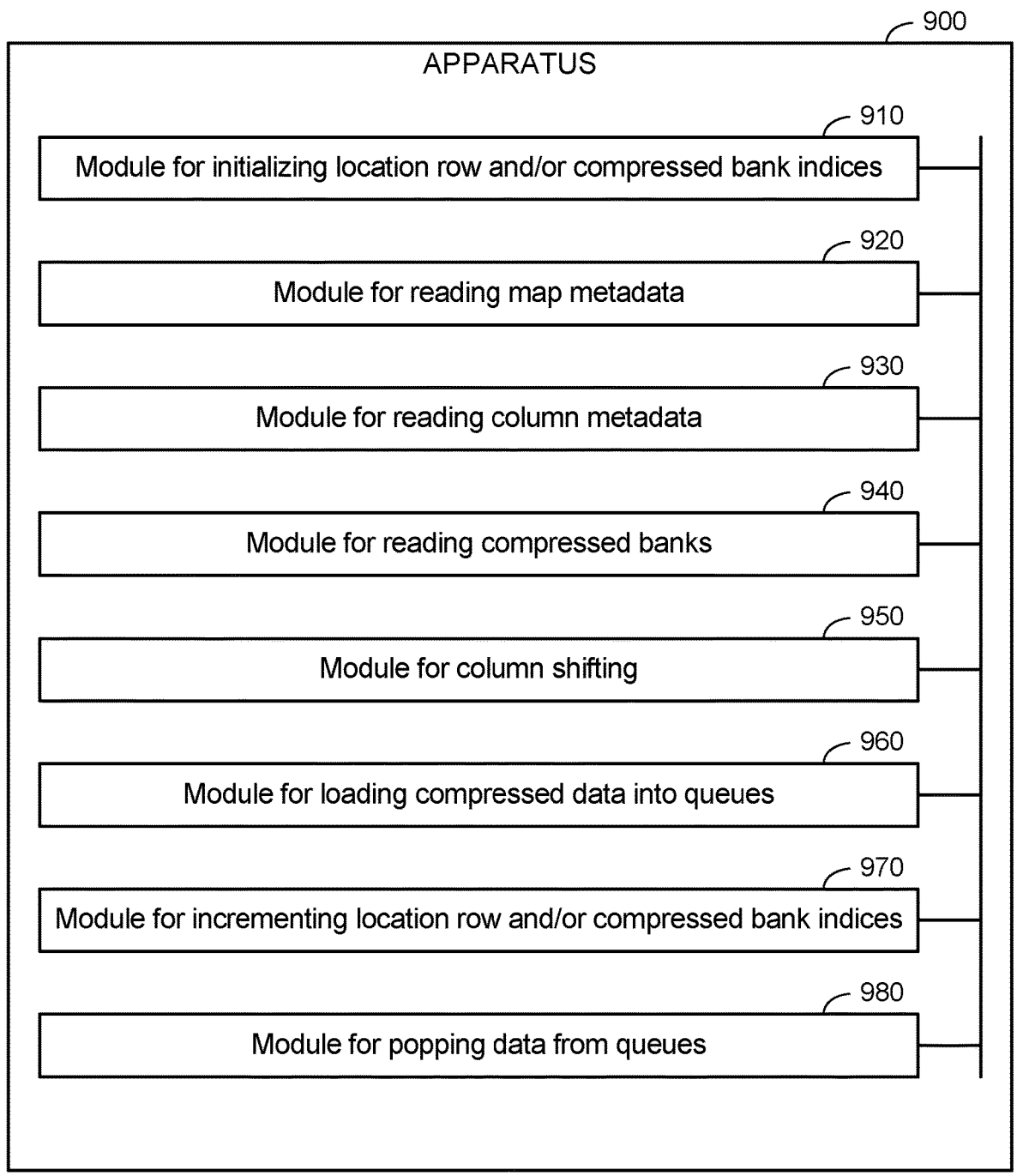
FIG. 9 illustrates simplified block diagrams of several sample aspects of an apparatus configured to decompress compressed data block in accordance with one or more aspects.

FIG. 9 illustrates an example apparatus 900 configured to perform decompression on stack compressed data. The apparatus 900 is represented as a series of interrelated functional modules 910-980 connected by a common bus. The apparatus 900 may include a module 910 for initializing location row and/or compressed bank indices that performs block 610 of the method 600, a module 920 for reading map metata that performs block 630 of the method 600, a module 930 for reading column metadata that performs block 805 of the method 600, a module 940 for reading compressed banks that performs block 810 of the method 600, a module 950 for column shifting that performs block 820 of the method 600, a module 960 for loading compressed data into queues that perform blocks 710 and 830 of the method 600, a module 970 for incrementing location row and/or compressed bank indices that performs blocks 660 and 680 of the method 600, and a module 980 for popping data from queues that performs block 670 of the method 600. Each of the modules 910-980 may be implemented in hardware or as a combination of hardware and software. For example, the modules 910-980 may be implemented as any combination of the components of the apparatus 500 of FIG. 5.

The functionality of the modules of FIG. 9 may be implemented in various ways consistent with the teachings herein. In some designs, the functionality of these modules may be implemented as one or more electrical components. In some designs, the functionality of these blocks may be implemented as a processing system including one or more processor components. In some designs, the functionality of these modules may be implemented using, for example, at least a portion of one or more integrated circuits (e.g., an ASIC). As discussed herein, an integrated circuit may include a processor, software, other related components, or some combination thereof. Thus, the functionality of different modules may be implemented, for example, as different subsets of an integrated circuit, as different subsets of a set of software modules, or a combination thereof. Also, it will be appreciated that a given subset (e.g., of an integrated circuit and/or of a set of software modules) may provide at least a portion of the functionality for more than one module.

In addition, the components and functions represented by FIG. 9, as well as other components and functions described herein, may be implemented using any suitable means. Such means also may be implemented, at least in part, using corresponding structure as taught herein. For example, the components described above in conjunction with the "module for" components of FIG. 9 also may correspond to similarly designated "means for" functionality. Thus, in some aspects one or more of such means may be implemented using one or more of processor components, integrated circuits, or other suitable structure as taught herein.

The proposed decompression engine can provide both footprint (capacity) and bandwidth compression. Compression can be in both SRAM and DDR types of memories. The decompression engine can operate at fast speeds, e.g., at SRAM speeds. Further the decompression can recover the original data without loss.

FIG. 10 illustrates simulated results of effective compression achieved with the proposed compression/decompression given the number of banks and sparsity level. In FIG. 10, the numbers represent relative sizes of compressed data blocks to uncompressed blocks. As such, smaller number represents greater compression. As seen, effective compression generally correlates with sparsity. This is logical since compression is achieved by removing zero words from uncompressed data blocks. Note that in an aspect, the vertical ratios in FIG. 10 may represent savings in power, capacity and bandwidth. The horizontal ratios may represent power savings when the same number of banks are used for storing and reading.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus, comprising:
a processor and memory configured to:
retrieve a compressed data block and a map metadata, the compressed data block comprising one or more words and the map metadata configured to map the words of the compressed data block to locations in a decompressed data block; and
decompress the compressed data block to generate the decompressed data block in accordance with the map metadata,
wherein the compressed data block is compressed from an uncompressed data block comprising a plurality of words, each word of the uncompressed data block being removable or non-removable, the uncompressed data block having been compressed into the compressed data block by removing one or more removable words from the uncompressed data block.

2. The apparatus of claim 1,
wherein the map metadata maps the removable and the non-removable words of the uncompressed data block, and
wherein the uncompressed data block is recovered in the decompressed data block.

3. The apparatus of claim 2,
wherein a number of non-removable words in the compressed data block is equal to a number of non-removable words in the uncompressed data block, and/or
wherein a number of removable words in the compressed data block is less than a number of removable words in the uncompressed data block.

4. The apparatus of claim 2, wherein each non-removable word of the uncompressed data block is stored in a word of the compressed data block without modifications.

5. The apparatus of claim 2,
wherein the compressed data block is arranged in row and column dimensions comprising M compressed banks in the row dimension, M≥1 and C columns in the column dimension, C≥1,
wherein the uncompressed data block is arranged in the row and column dimensions comprising Nuncompressed banks in the row dimension, N≥1 and also comprising C columns in the column dimension, and
wherein the uncompressed data block has been stack compressed into the compressed data block at least in the row dimension such that M≤N.

6. The apparatus of claim 5, wherein at least one column of the compressed data block is such that all words of the at least one column are non-removable words.

7. The apparatus of claim 5,
wherein the map metadata comprises a matrix of Nrows x C columns of elements such that each element (n, c), n=0 . . . N−1, c=0 . . . C−1 of the map metadata corresponds to a word in bank n, column c of the uncompressed data block, and
wherein each element of the map metadata comprises a bit configured to indicate whether the corresponding word of the uncompressed data block is removable or non-removable.

8. The apparatus of claim 7,
wherein each element of the map metadata also corresponds to a word in bank n, column c of the decompressed data block, and
wherein in decompressing the compressed data block to generate the decompressed data block, the processor and the memory are configured to:
for each element of the map metadata indicating that the corresponding word of the uncompressed data block is removable, fill the corresponding word of the decompressed data block with the removable word; and
for each element of the map metadata indicating that the corresponding word of the uncompressed data block is non-removable, load the corresponding word of the decompressed data block with one of the non-removable words from the compressed data block.

9. The apparatus of claim 7, wherein the processor and the memory are configured to decompress the compressed data block to recover the uncompressed data block based on a num-compressed-banks metadata in addition to the map metadata, the num-compressed-banks metadata being configured to indicate the number M of the compressed banks of the compressed data block.

10. The apparatus of claim 9, wherein the processor and the memory are configured to:
retrieve the num-compressed-banks metadata along with the compressed data block and the map metadata, and/or determine the num-compressed-banks metadata based on the map metadata.

11. The apparatus of claim 9,
wherein the apparatus further comprises at least C queues corresponding to the C columns, each queue having a depth S number of slots, S≥1,
wherein in decompressing the compressed data block to generate the decompressed data block, the processor and the memory are configured to:
initialize a row index n;
initialize a compressed bank index m;
when the row index n<N, perform a row decompression operation comprising:
reading row n of the map metadata based on the row index;
when the compressed bank index m<M,
loading words of the compressed bank m of the compressed data block into the queues; and
incrementing the compressed bank index m;
popping a word from head of each queue c as decompressed bank data based on the row n read from the map metadata; and
incrementing the row index n, and
wherein the decompression engine is configured to repeat the row decompression operation for each row index n.

12. The apparatus of claim 11, wherein in loading the words of the compressed bank m of the compressed data block into the queues, the processor and the memory are configured to load each word corresponding to each column c of the compressed bank m to occupy a lowest unoccupied slot of the corresponding queue c.

13. The apparatus of claim 11,
wherein the uncompressed data block has been stack compressed in both row and column dimensions such that in each compressed bank m of the compressed data block, a non-removable word occupies a left most column c=0 of that compressed bank m, and
wherein the processor and the memory are configured to load the words of the compressed bank m of the compressed data block into the queues based on a column metadata configured to map removable and non-removable words of the compressed data block after compression in the row dimension and before compression in the column dimension.

14. The apparatus of claim 13, wherein the processor and the memory are configured to:
retrieve the column metadata along with the compressed data block and the map metadata, and/or
determine the column metadata based on the map metadata.

15. The apparatus of claim 13,
wherein the column metadata comprises a matrix of M rows×C columns such that each element (m, c), m=0 ... M−1, c=0 ... C−1 of the column metadata corresponds to a word in bank m, column c of the compressed data block after the compression in the row dimension and before the compression in the column dimension,
wherein each element of the column metadata comprises a bit configured to indicate whether the corresponding word in the compressed data block is removable or non-removable,
wherein in loading the words of the compressed bank m of the compressed data block into the queues, the processor and the memory are configured to:
read a row m of the column metadata based on the compressed bank index;
read the words of the compressed bank m of the compressed data block based on the row m read from the column metadata;
column shift the words read from the compressed bank m of the compressed data block in accordance with the row m read from the column metadata; and
load each shifted word of the compressed data block corresponding to each column c of the compressed bank m to occupy a lowest unoccupied slot of the corresponding queue c.

16. The apparatus of claim 15, wherein the decompression engine is configured to perform read-under-mask based on the row m read from the column metadata when reading the compressed bank m of the compressed data block.

17. The apparatus of claim 1, wherein an uncompressed data block is recovered without loss in the decompressed data block.

18. A method of a decompression engine, the method comprising:
retrieving, by the decompression engine, a compressed data block and a map metadata, the compressed data block comprising one or more words and the map metadata configured to map the words of the compressed data block to locations in a decompressed data block; and
decompressing, by the decompression engine, the compressed data block to generate the decompressed data block in accordance with the map metadata,
wherein the decompression engine comprises a processor and memory, and
wherein the compressed data block is compressed from an uncompressed data block comprising a plurality of words, each word of the uncompressed data block being removable or non-removable, the uncompressed data block having been compressed into the compressed data block by removing one or more removable words from the uncompressed data block.

19. The method of claim 18,
wherein the map metadata maps the removable and the non-removable words of the uncompressed data block, and
wherein the uncompressed data block is recovered in the decompressed data block.

20. The method of claim 19,
wherein a number of non-removable words in the compressed data block is equal to a number of non-removable words in the uncompressed data block, and/or
wherein a number of removable words in the compressed data block is less than a number of removable words in the uncompressed data block.

21. The method of claim 19, wherein each non-removable word of the uncompressed data block is stored in a word of the compressed data block without modifications.

22. The method of claim 19,
wherein the compressed data block is arranged in row and column dimensions comprising M compressed banks in the row dimension, M≥1 and C columns in the column dimension, C≥1,
wherein the uncompressed data block is arranged in the row and column dimensions comprising Nuncompressed banks in the row dimension, N≥1 and also comprising C columns in the column dimension, and
wherein the uncompressed data block has been stack compressed into the compressed data block at least in the row dimension such that M≤N.

23. The method of claim 22,
wherein the map metadata comprises a matrix of N rows×C columns of elements such that each element (n, c), n=0 . . . N−1, c=0 . . . C−1 of the map metadata corresponds to a word in bank n, column c of the uncompressed data block, and
wherein each element of the map metadata comprises a bit configured to indicate whether the corresponding word of the uncompressed data block is removable or non-removable.

24. The method of claim 23,
wherein each element of the map metadata also corresponds to a word in bank n, column c of the decompressed data block, and
wherein decompressing the compressed data block to generate the decompressed data block comprises:
for each element of the map metadata indicating that the corresponding word of the uncompressed data block is removable, filling the corresponding word of the decompressed data block with the removable word; and
for each element of the map metadata indicating that the corresponding word of the uncompressed data block is non-removable, loading the corresponding word of the decompressed data block with one of the non-removable words from the compressed data block.

25. The method of claim 23, wherein decompressing the compressed data block to generate a decompressed data block comprises:
initializing a row index n;
initializing a compressed bank index m;
when the row index n<N, performing a row decompression operation comprising:
reading row n of the map metadata based on the row index;
when the compressed bank index m<M,
loading words of the compressed bank m of the compressed data block into C queues corresponding to the C columns, each queue having a depth S number of slots, S≥1; and
incrementing the compressed bank index m;
popping a word from head of each queue c as decompressed bank data based on the row n read from the map metadata; and
incrementing the row index n,
wherein the method comprises repeating the row decompression operation for each row index n.

26. The method of claim 25, wherein loading the words of the compressed bank m of the compressed data block into the C queues comprises loading each word corresponding to each column c of the compressed bank m to occupy a lowest unoccupied slot of the corresponding queue c.

27. The method of claim 25,
wherein the uncompressed data block has been stack compressed in both row and column dimensions such that in each compressed bank m of the compressed data block, a non-removable word occupies a left most column c=0 of that compressed bank m,
wherein the method further comprises retrieving a column metadata comprising a matrix ofMrows x C columns such that each element (m, c), m=0 . . . M−1, c=0 . . . C−1 of the column metadata corresponds to a word in bank m, column c of the compressed data block after the compression in the row dimension and before the compression in the column dimension,
wherein each element of the column metadata comprises a bit configured to indicate whether the corresponding word in the compressed data block is removable or non-removable, and
wherein loading the words of the compressed bank m of the compressed data block into the C queues comprises:
reading a row m of the column metadata based on the compressed bank index;
reading the words of the compressed bank m of the compressed data block based on the row m read from the column metadata;
column shifting the words read from the compressed bank m of the compressed data block in accordance with the row m read from the column metadata; and
loading each shifted word of the compressed data block corresponding to each column c of the compressed bank m to occupy a lowest unoccupied slot of the corresponding queue c.

28. The method of claim 18, wherein the uncompressed data is recovered without loss in the decompressed data block.

29. An apparatus, comprising:
means for retrieving a compressed data block and a map metadata, the compressed data block comprising one or more words and the map metadata configured to map the words of the compressed data block to locations in a decompressed data block; and
means for decompressing the compressed data block to generate the decompressed data block in accordance with the map metadata,
wherein the means for retrieving and the means for decompressing are both means of a decompression engine comprising a processor and memory, and
wherein the compressed data block is compressed from an uncompressed data block comprising a plurality of words, each word of the uncompressed data block being removable or non-removable, the uncompressed data block having been compressed into the compressed data block by removing one or more removable words from the uncompressed data block.

30. A non-transitory computer-readable medium storing computer-executable instructions for an apparatus, the computer-executable instructions comprising:
one or more instructions causing the apparatus to retrieve a compressed data block and a map metadata, the compressed data block comprising one or more words and the map metadata configured to map the words of the compressed data block to locations in a decompressed data block; and
one or more instructions causing the apparatus to decompress the compressed data block to generate the decompressed data block in accordance with the map metadata,
wherein the compressed data block is compressed from an uncompressed data block comprising a plurality of words, each word of the uncompressed data block being removable or non-removable, the uncompressed data block having been compressed into the compressed data block by removing one or more removable words from the uncompressed data block.

\* \* \* \* \*